United States Patent
Etawil et al.

(10) Patent No.: US 7,107,556 B1
(45) Date of Patent: Sep. 12, 2006

(54) METHOD AND SYSTEM FOR IMPLEMENTING AN ANALYTICAL WIRELENGTH FORMULATION FOR UNAVAILABILITY OF ROUTING DIRECTIONS

(75) Inventors: Hussein Etawil, Santa Clara, CA (US); Krishna Belkhale, Saratoga, CA (US); Lu Sha, San Jose, CA (US); Jonathan Frankle, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/026,339

(22) Filed: Dec. 29, 2004

(51) Int. Cl.
G06F 17/50 (2006.01)

(52) U.S. Cl. .................. 716/5; 716/7; 716/8; 716/9; 716/13; 716/14; 703/1; 174/261

(58) Field of Classification Search .............. 716/4, 716/7, 8, 9, 13, 14; 703/1; 174/261
See application file for complete search history.

(56) References Cited

U.S. PATENT DOCUMENTS

| | | | | |
|---|---|---|---|---|
| 4,615,011 A | * | 9/1986 | Linsker | 716/13 |
| 4,782,193 A | * | 11/1988 | Linsker | 174/261 |
| 5,784,289 A | * | 7/1998 | Wang | 716/8 |
| 6,155,725 A | * | 12/2000 | Scepanovic et al. | 716/9 |
| 6,493,658 B1 | * | 12/2002 | Koford et al. | 703/1 |
| 6,671,864 B1 | * | 12/2003 | Teig et al. | 716/8 |
| 2001/0018759 A1 | * | 8/2001 | Andreev et al. | 716/7 |
| 2003/0101428 A1 | * | 5/2003 | Teig et al. | 716/14 |
| 2004/0098697 A1 | * | 5/2004 | Frankle et al. | 716/13 |

OTHER PUBLICATIONS

"The X Architecture: not your father's diagonal wiring", ACM, 2002, S. Teig.*
"A Timing-Constrained Simultaneous Global Routing Algorithm", IEEE Transactions on Computer-Aided Design of Integrated Circuits and Systems, vol. 21, No. 9, Sep. 2002, pp. 1025-1036, J. Hu et al.*
"Congestion Reduction during Placement with Provable Good Approximation Bound", ACM Trans. on Design Automation of Electronic Systems, vol. V, No. N, Feb. 2003, pp. 1-17, X. Yang et al.*

* cited by examiner

Primary Examiner—A. M. Thompson
Assistant Examiner—Nelson Lam
(74) Attorney, Agent, or Firm—Bingham McCutchen LLP

(57) ABSTRACT

Disclosed are methods and systems for formulating a wirelength estimate that takes into account whether any of the routing directions are unavailable. Under certain circumstances, one or more of the routing layers may not be available for routing a wire. If this occurs, then the bounding box that is determined for performing the wirelength estimate would take into account the unavailability of the layer.

18 Claims, 33 Drawing Sheets

Fig. 1 - Diagonal Wiring
(Prior Art)

Fig. 2 - Layers with Different Routing Directions (Prior Art)

Fig. 3 - Manhattan
Bounding Box
(Prior Art)

Architecture with diagonal wiring:
Est. Wirelength = ½ (x_a + x_b + y_a + y_b + D1_a + D1_b + D2_a + D2_b)

Fig. 4 - Octagonal Bounding Box

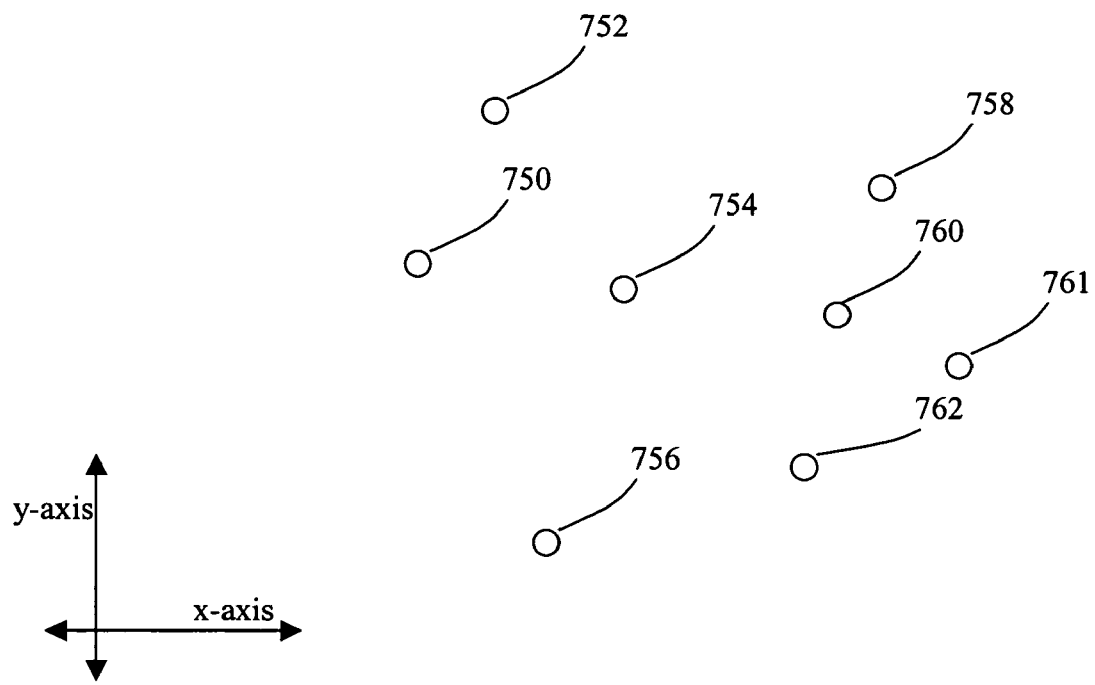
Fig. 7A - Set of Pins to Connect

Xmin( x(1), y(1), .....x(n), y(n) )
    = - scale * log ( Sum ( e ** (-x(i)/ scale ) )

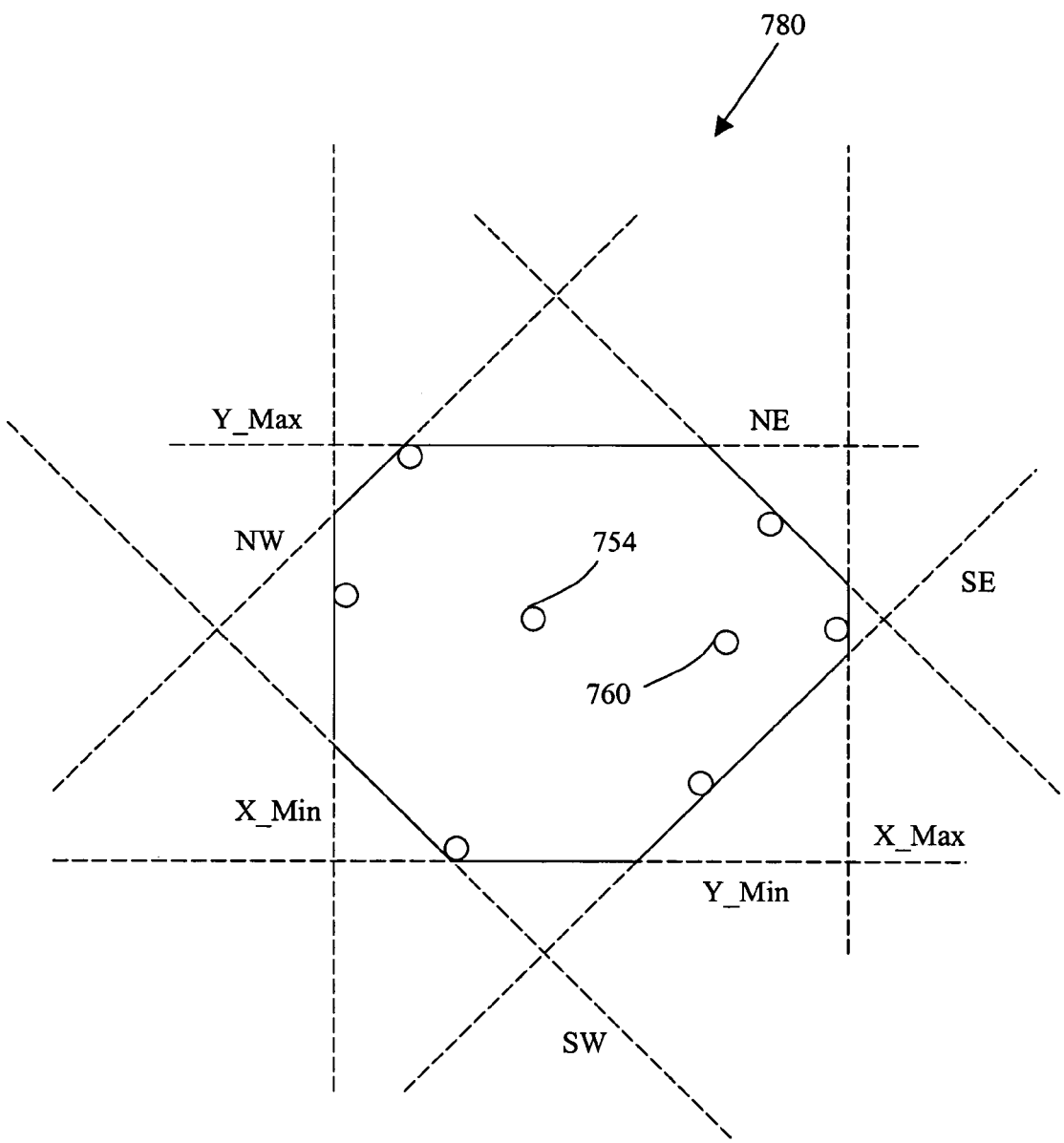
Fig. 7J - Outline Bounding Box

Est. Wirelength = ½ ($L_{Y\_max} + L_{Y\_min} + L_{X\_max} + L_{X\_min} + L_{NW} + L_{NE} + L_{SW} + L_{SE}$)
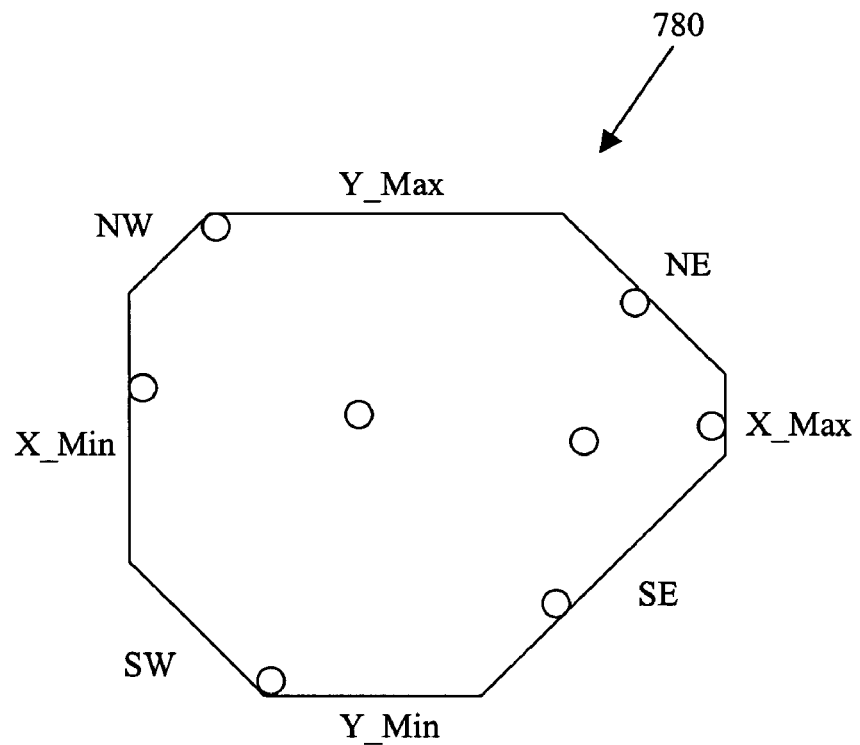
Fig. 7K - Estimate Wire Length

Example Bounding Box

Est. Wirelength = ½ ($L_{NW} + L_{NE} + L_{SW} + L_{SE}$)
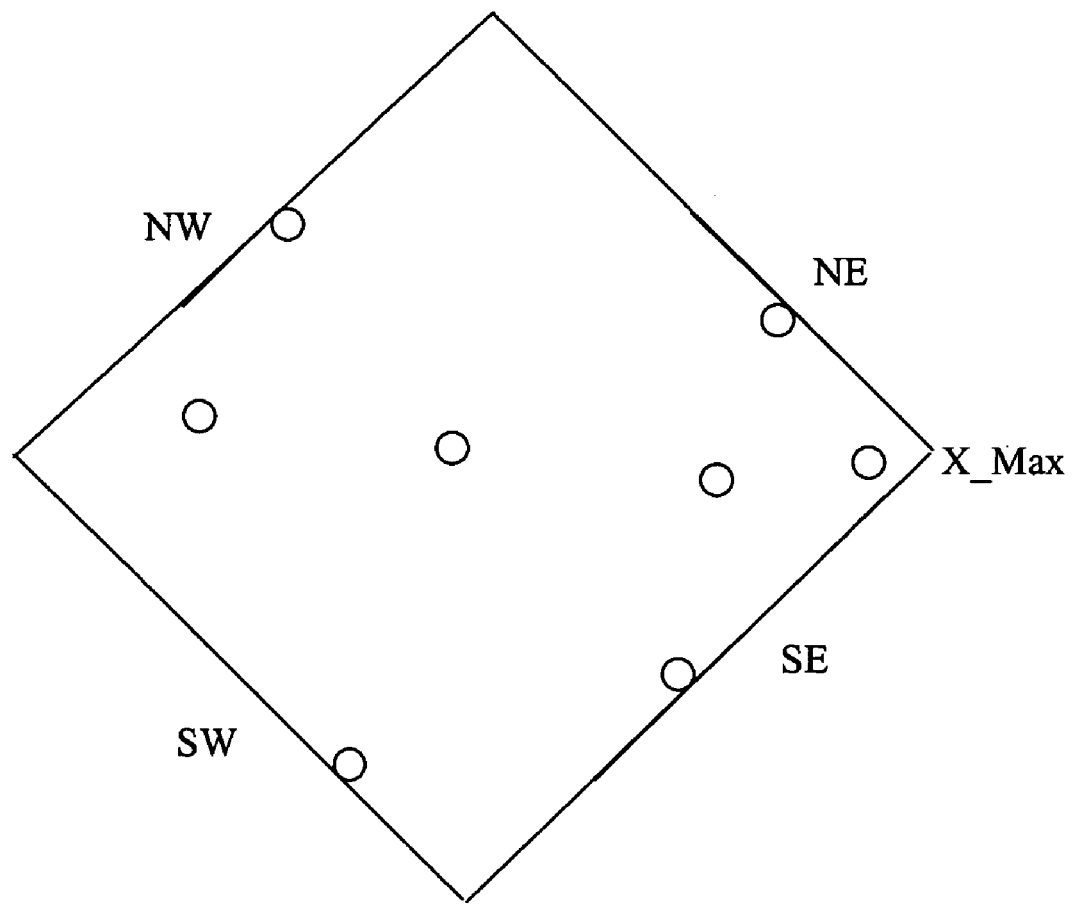
Fig. 11B - Compensated Bounding Box Est. Wirelength = ½ ($L_{Y\_max} + L_{Y\_min} + L_{NW} + L_{NE} + L_{SW} + L_{SE}$)
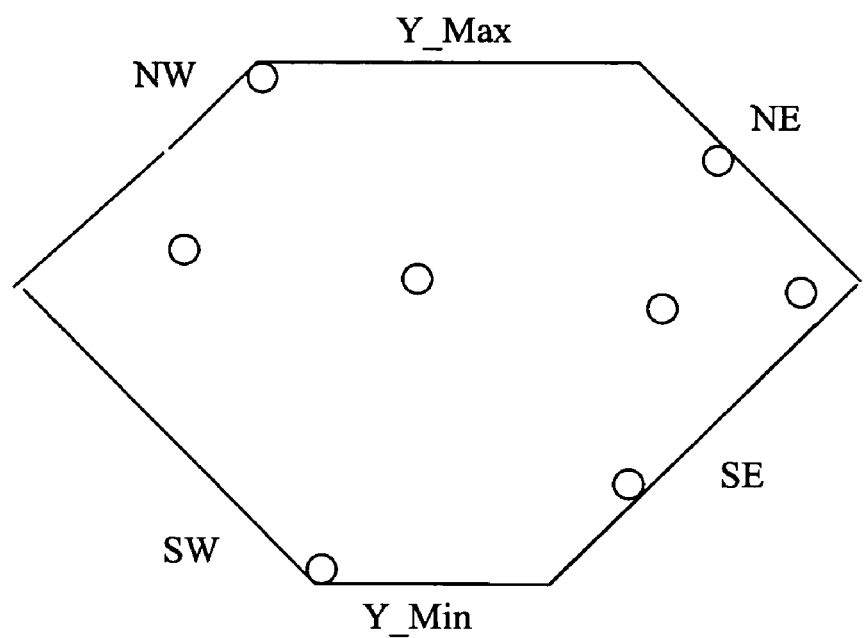
Fig. 12B - Compensated Bounding Box Est. Wirelength = ½ ($L_{X\_max} + L_{X\_min} + L_{NW} + L_{NE} + L_{SW} + L_{SE}$)
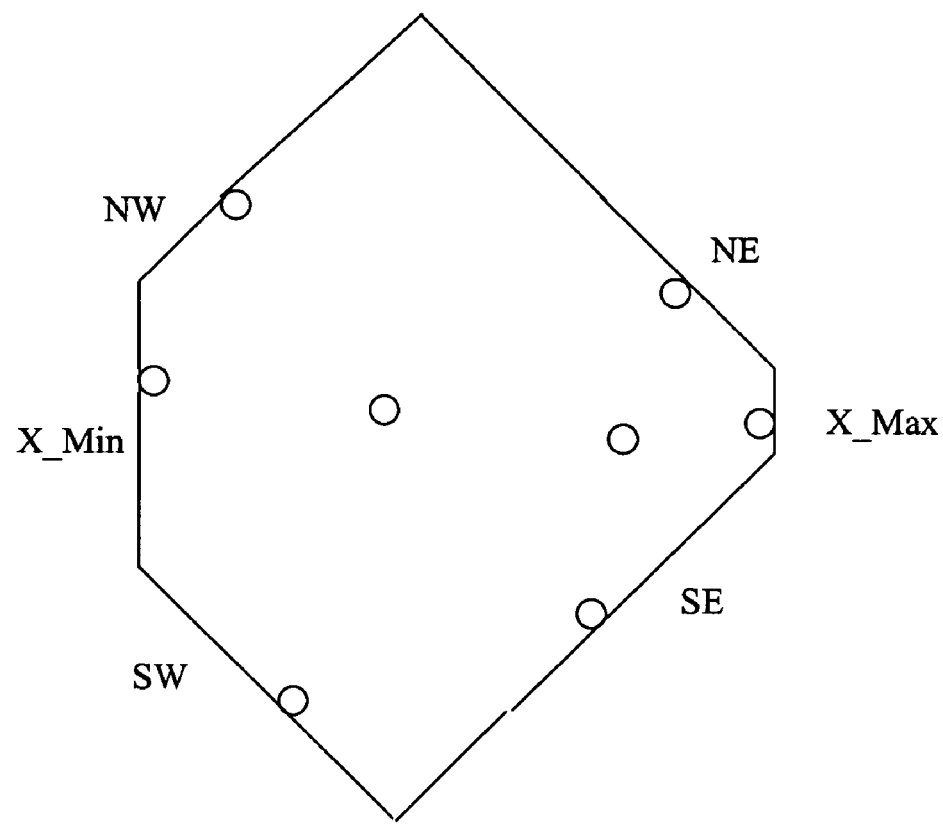
Fig. 13B - Compensated Bounding Box Est. Wirelength = ½ ($L_{X\_max} + L_{X\_min} + L_{X\_max} + L_{X\_min} + L_{NW} + L_{SE}$)
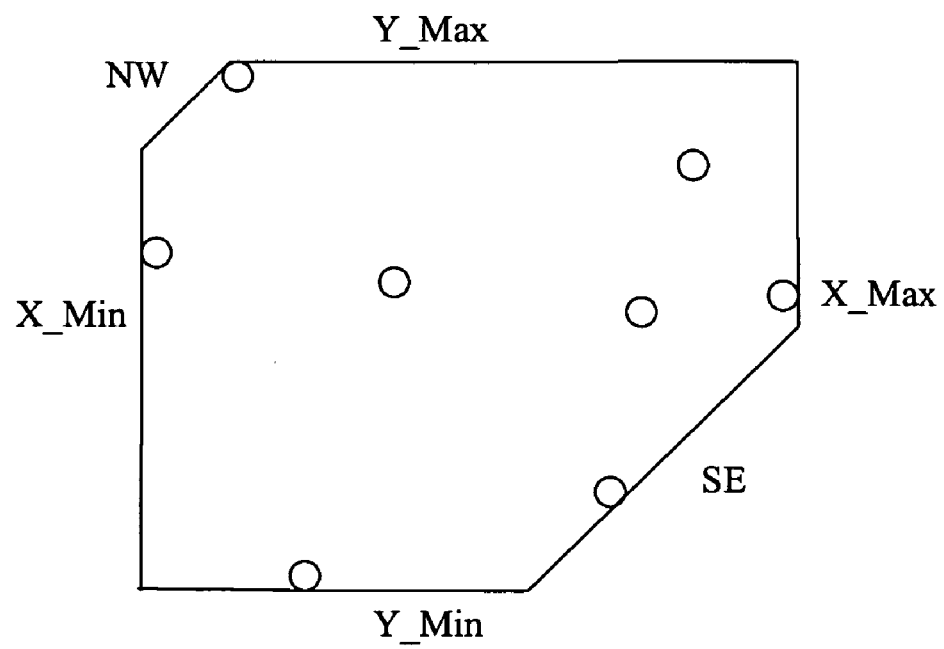
Fig. 14B - Compensated Bounding Box Est. Wirelength = ½ ($L_{X\_max} + L_{X\_min} + L_{X\_max} + L_{X\_min} + L_{SW} + L_{NE}$)
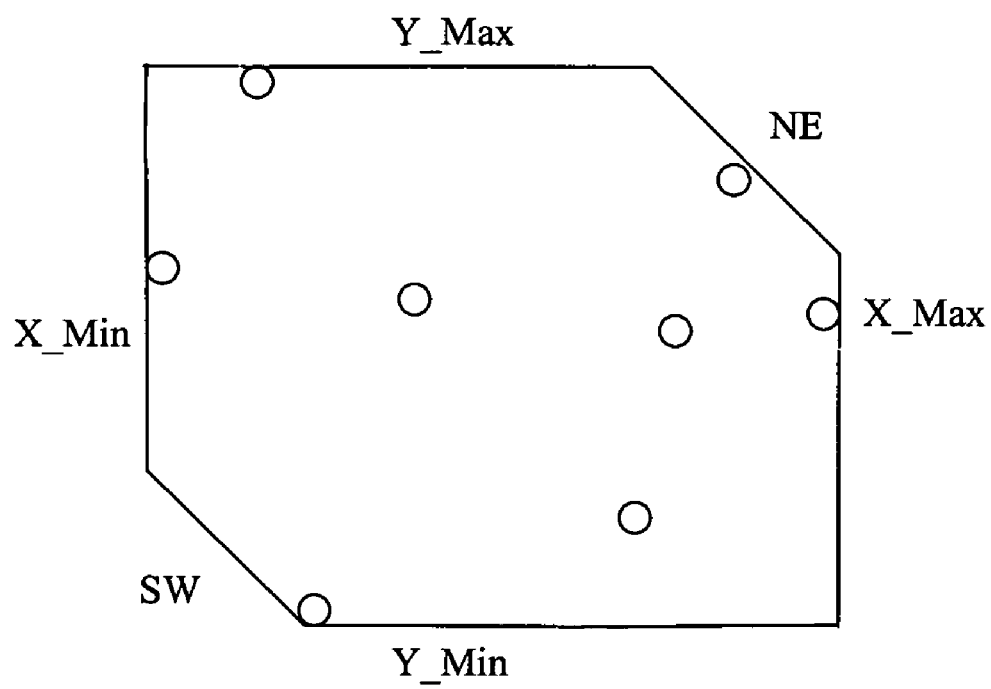
Fig. 15B - Compensated Bounding Box

METHOD AND SYSTEM FOR IMPLEMENTING AN ANALYTICAL WIRELENGTH FORMULATION FOR UNAVAILABILITY OF ROUTING DIRECTIONS

BACKGROUND AND SUMMARY

The present invention relates to an improved method and system for estimating wire length values for an integrated circuit.

An integrated circuit ("IC") is a semiconductor device that includes many electronic components (e.g., transistors, resistors, diodes, etc.). These components are often interconnected to form multiple circuit components (e.g., gates, cells, memory units, arithmetic units, controllers, decoders, etc.) on the IC. The electronic and circuit components of IC's are jointly referred to below as "components."

An IC also includes multiple layers of metal and/or polysilicon wiring (collectively referred to below as "metal layers") that interconnect its electronic and circuit components. For instance, many IC's are currently fabricated with five to seven metal layers. In theory, the wiring on the metal layers can be all-angle wiring (i.e., the wiring can be in any arbitrary direction). Such all-angle wiring is commonly referred to as Euclidean wiring. In practice, however, each metal layer typically has a preferred wiring direction, and the preferred direction alternates between successive metal layers. Many IC's use the Manhattan wiring model, which specifies alternating layers of preferred-direction horizontal and vertical wiring. In this wiring model, the majority of the wires can only make 90 degree turns. However, occasional diagonal jogs are sometimes allowed on the preferred horizontal and vertical layers. Design engineers design IC's by transforming circuit description of the IC's into geometric descriptions, called layouts. To create layouts, design engineers typically use electronic design automation ("EDA") tools. These tools provide sets of computer-based applications for creating, editing, and analyzing IC design layouts.

IC's can also be fabricated with diagonal interconnect lines (i.e., diagonal wiring). In some of these embodiments, the IC layouts not only have diagonal interconnect lines, but also have horizontal and vertical interconnect lines. As used in this document, an interconnect line is "diagonal" if it forms an angle other than zero or ninety degrees with respect to one of the sides of the layout boundary. On the other hand, an interconnect line is "horizontal" or "vertical" if it forms an angle of 0 degree or 90 degree with respect to one of the sides of the layout.

FIG. 1 illustrates the wiring architecture (i.e., the interconnect-line architecture) of an IC layout 700 that utilizes horizontal, vertical, and 45 degrees diagonal interconnect lines. In this document, this architecture is referred to as the octagonal wiring model, in order to convey that an interconnect line can traverse in eight separate directions from any given point.

The horizontal lines 705 are the lines that are parallel (i.e., are at 0 degrees) to the x-axis, which is defined to be parallel to the width 710 of the layout. The vertical lines 715 are parallel to the y-axis, which is defined to be parallel to the height 720 of the layout. In other words, the vertical interconnect lines 715 are perpendicular (i.e., are at 90 degrees) to the width of the IC layout. In this architecture, one set 725 of diagonal lines are at +45 degrees with respect to the width of the IC layout, while another set 730 are at −45 degrees with respect to the width of the IC layout.

FIG. 2 illustrates one manner of implementing the wiring architecture illustrated in FIG. 1 on an IC. Specifically, FIG. 2 illustrates five metal layers for an IC. The first three layers 805–815 are Manhattan layers. In other words, the preferred direction for the wiring in these layers is either the horizontal direction or the vertical direction. The preferred wiring direction in the first three layers typically alternates so that no two consecutive layers have the same direction wiring. However, in some cases, the wiring in consecutive layers is in the same direction.

The next two layers 820 and 825 are diagonal layers. The preferred direction for the wiring in the diagonal layers is +/−45 degrees. Also, as in the first three layers, the wiring directions in the fourth and fifth layer are typically orthogonal (i.e., one layer is +45 degrees and the other is −45 degrees), although they do not have to be.

Even though some embodiments of the invention are described below to work with IC layouts that utilize the above-described octagonal wiring model, one of ordinary skill will understand that the invention can be used with any wiring model. For instance, the invention can be used with wiring architectures that are strictly diagonal (i.e., that do not have horizontal and vertical preferred direction wiring).

Also, some embodiments are used with non-45 degrees diagonal wiring. For example, some embodiments are used with IC layouts that have horizontal, vertical, +/−60 degrees, and/or +/−120 degrees diagonal interconnect lines.

EDA tools create layouts by using geometric shapes that represent different materials and devices on IC's. For instance, EDA tools commonly use rectangular lines to represent the wire segments that interconnect the IC components. These tools also represent electronic and circuit IC components as geometric objects with varying shapes and sizes. For the sake of simplifying the discussion, these geometric objects are shown as rectangular blocks in this document.

A net is typically defined as a collection of pins that need to be electrically connected. A list of all or some of the nets in a layout is referred to as a net list. In other words, a net list specifies a group of nets, which, in turn, specify the interconnections between a set of pins.

Placement is a key operation in the physical design cycle. It is the process of arranging the circuit modules on a layout, in order to achieve certain objectives, such as reducing layout area, wirelength, wire congestion, etc. A poor placement configuration not only can consume a large area, but it also can make routing difficult and result in poor performance.

Numerous EDA placers have been proposed to date. Certain placers are constrained-optimization placers, which (1) use cost-calculating functions to generate placement scores (i.e., placement costs) that quantify the quality of placement configurations, and (2) use optimization algorithms to modify iteratively the placement configurations to improve the placement scores generated by the cost-calculating functions.

A constrained-optimization placer typically receives (1) a list of circuit modules, (2) an initial placement configuration for these modules, and (3) a net list that specifies the interconnections between the modules. The initial placement configuration can be random (i.e., all the modules can be positioned randomly). Alternatively, the initial configuration can be partially or completely specified by a previous physical-design operation, such as the floor planning.

A constrained-optimization placer then uses a cost-calculating function to measure the quality of the initial placement configuration. The cost function generates a metric score that is indicative of the placement quality. Different cost-calculating functions measure different placement metrics. For instance, as further described below, some functions measure wirelength (e.g., measure each net's minimum spanning tree, Steiner tree, or bounding-box perimeter, etc.), while others measure congestion (e.g., measure number of nets intersected by cut lines).

After calculating the metric cost of the initial placement configuration, a constrained-optimization placer uses an optimization algorithm to modify iteratively the placement configuration to improve the placement score generated by its cost-calculating function. Different optimization techniques modify the placement configuration differently. For instance, at each iteration, some techniques move one circuit module, others swap two modules, and yet others move a number of related modules. Also, at each iteration, some optimization techniques (e.g., KLFM and tabu search algorithms) search for the best move, while others (e.g., simulated annealing and local optimization) select random moves. In addition, some techniques (e.g., simulated annealing) accept moves that make the metric score worse, whereas others (e.g., local optimization) do not.

One type of constrained-optimization placement techniques is the semi-perimeter method. The semi-perimeter method is a cost-calculating function used by some constrained-optimization techniques. This method quickly generates an estimate of the wirelength cost of a placement. For each net, this method typically (1) finds the smallest bounding-box that encloses all the net's pins, and (2) computes half the perimeter of this bounding rectangle.

FIG. 3 illustrates a rectangular bounding box 300 for a net that contains pins 302, 304, 306, 308, 310, 312, and 314. The computed semi-perimeter value of this box 300 equals the sum of its width x and height y. This computed semi-perimeter value provides a lower bound estimate on the amount of wire required to route a net. A bounding box with a diagonal attribute can also be used to estimate wirelength cost. U.S. Pat. No. 6,671,864 describes one example approach for using a bounding box with a diagonal attribute to estimate a wirelength cost for placement, and is incorporated herein by reference in its entirety.

The semi-perimeter method sums the semi-perimeter values of all the bounding rectangles of all the nets to obtain an estimated wirelength cost for a placement configuration. An optimization technique can then be used to modify iteratively the placement configuration to reduce this wirelength cost estimate, and thereby obtain an acceptable placement configuration.

Methods and systems for specifying an analytical wirelength formulation that is continuous along with its derivative are disclosed in co-pending U.S. application Ser. No. 11/026,511, entitled "Method and System for Implementing an Analytical Wirelength Formulation", filed on even date herewith, which is hereby incorporated by reference in its entirety. The approach performs a wirelength estimate estimation in which a continuous formulation is employed to identify and use a bounding box to enclose circuit elements of a net, and in which an attribute of the bounding box may be completely or partially diagonal. Such formulations are used for optimizing the wirelength using numerical approaches. In addition, embodiments of the invention specifies a wirelength formulation based upon layer availability.

Referring back to FIG. 2, consider if one or more of the metal layers are unavailable, which means that one or more routing directions may be unavailable. This presents an additional challenge to determining an estimated wirelength since the unavailability of one or more routing directions will affect the shape and character of the bounding box that is used to enclose the circuit elements.

Embodiments of the invention provide methods and systems for formulating a wirelength estimate that takes into account whether any of the routing directions are unavailable. Under certain circumstances, one or more of the routing layers may not be available for routing a wire. If this occurs, then the bounding box that is determined for performing the wirelength estimate would likely take into account the unavailability of the layer.

Other and additional objects, features, and advantages of the invention are described in the detailed description, figures, and claims.

BRIEF DESCRIPTION OF THE DRAWINGS

The drawings illustrate the design and utility of embodiments of the present invention, in which similar elements are referred to by common reference numerals. In order to better appreciate the advantages and objects of a preferred embodiment, reference should be made to the accompanying drawings that illustrate this preferred embodiment. However, the drawings depict only one embodiment of the invention, and should not be taken as limiting its scope.

FIGS. 7A–K show an illustrated example of a process for performing wirelength analysis.

FIGS. 11A–B show an illustrated example of a process that looks at availability of routing layers, in which layers in the x and y directions are not available.

FIGS. 12A–B show an illustrated example of a process that looks at availability of routing layers, in which layers in the vertical directions are not available.

FIGS. 13A–B show an illustrated example of a process that looks at availability of routing layers, in which layers in the horizontal directions are not available.

FIGS. 14A–B show an illustrated example of a process that looks at availability of routing layers, in which layers in the SW and NE directions are not available.

FIGS. 15A–B show an illustrated example of a process that looks at availability of routing layers, in which layers in the NW and SE directions are not available.

DETAILED DESCRIPTION

For IC layouts that utilize horizontal, vertical, and diagonal interconnect lines, some embodiments of the invention compute a wirelength-cost estimate for each net in a net list, by (1) identifying a bounding box that encloses all the circuit elements of the net; and (2) determining the wirelength-cost estimate based upon the bounding box. The formulation used to determine the bounding box may be continuous along with its derivative.

Under certain circumstances, one or more of the routing layers may not be available for routing a wire. Therefore, some embodiments of the invention also provide methods and systems for formulating a wirelength estimate that takes into account whether any of the routing directions are unavailable.

Continuous Formulation to Perform Wirelength Analysis

A brief description will now be provided of a method and system for specifying an analytical wirelength formulation that is continuous along with its derivative. Further details regarding a preferred approach for implementing such a method and system are disclosed in co-pending U.S. application Ser. No. 11/026,511, entitled "Method and System for Implementing an Analytical Wirelength Formulation", filed on even date herewith, which is hereby incorporated by reference in its entirety.

Figure 1:
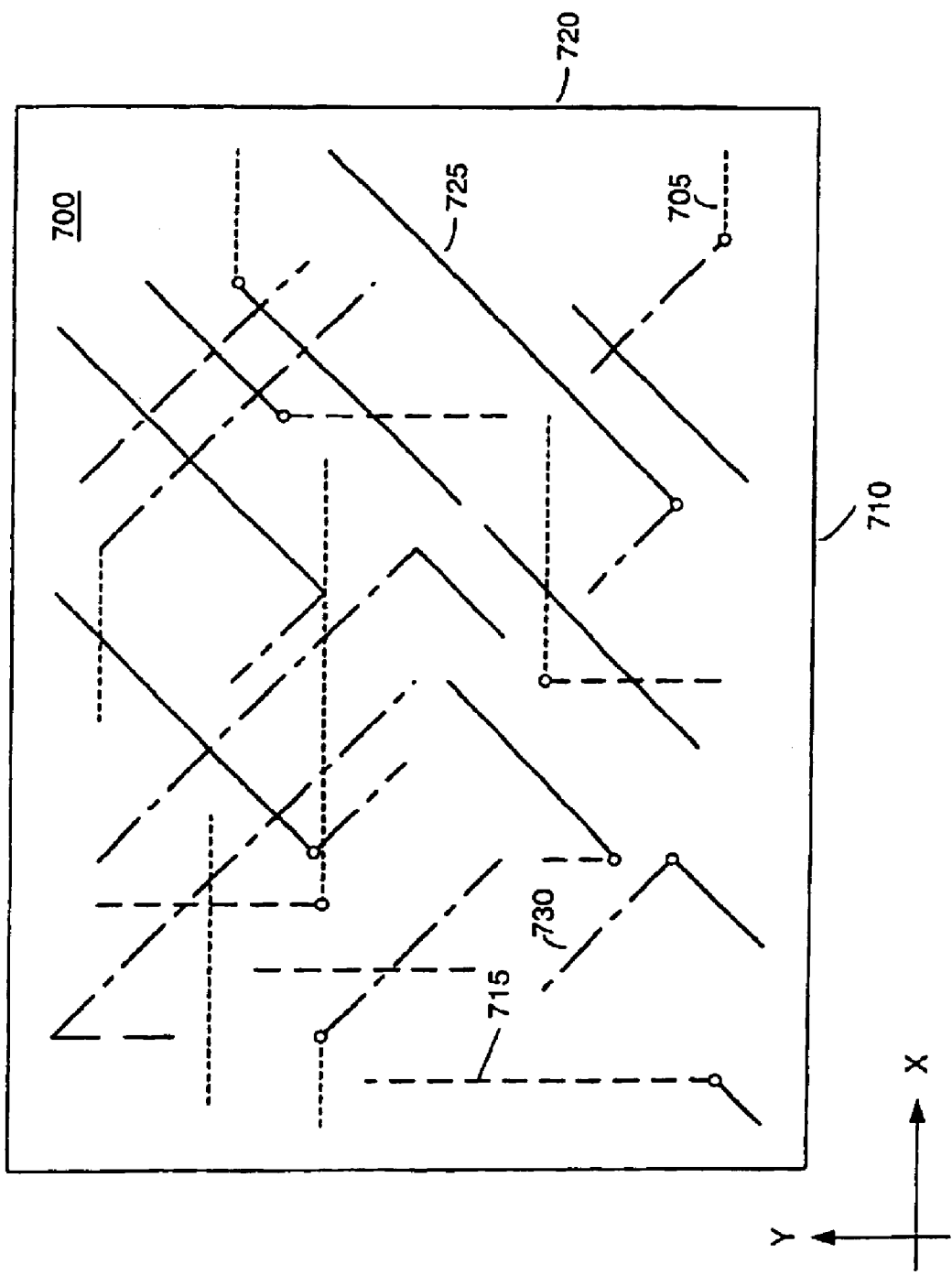
FIG. 1 illustrates the wiring architecture of an IC layout that utilizes horizontal, vertical, and 45 degrees diagonal interconnect lines.
Figure 2:
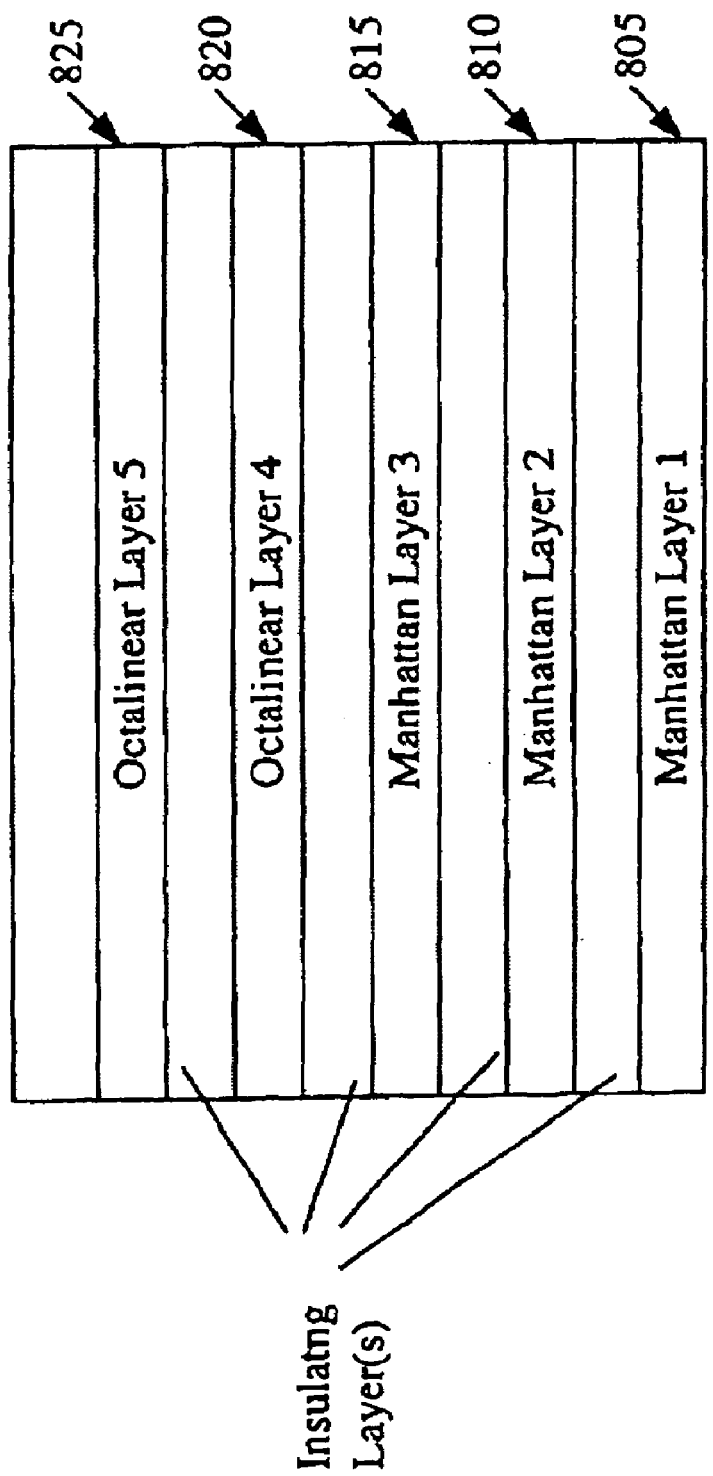
FIG. 2 illustrates multiple routing layers for an IC comprising horizontal, vertical, and 45 degrees diagonal routing directions.
Figure 3:
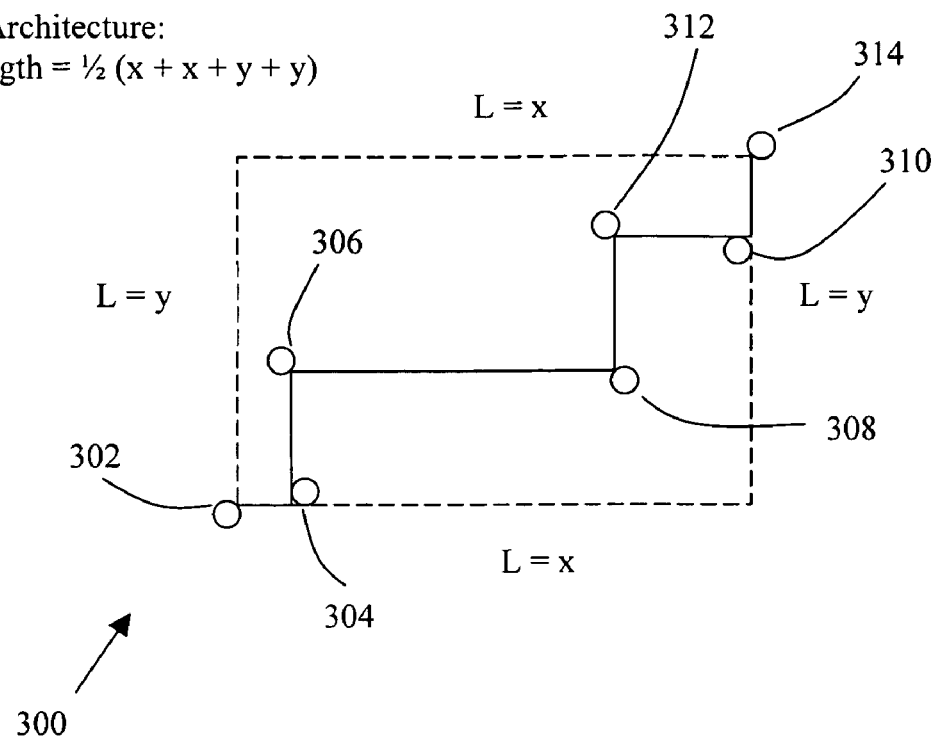
FIG. 3 shows a rectangular bounding box.
Figure 4:
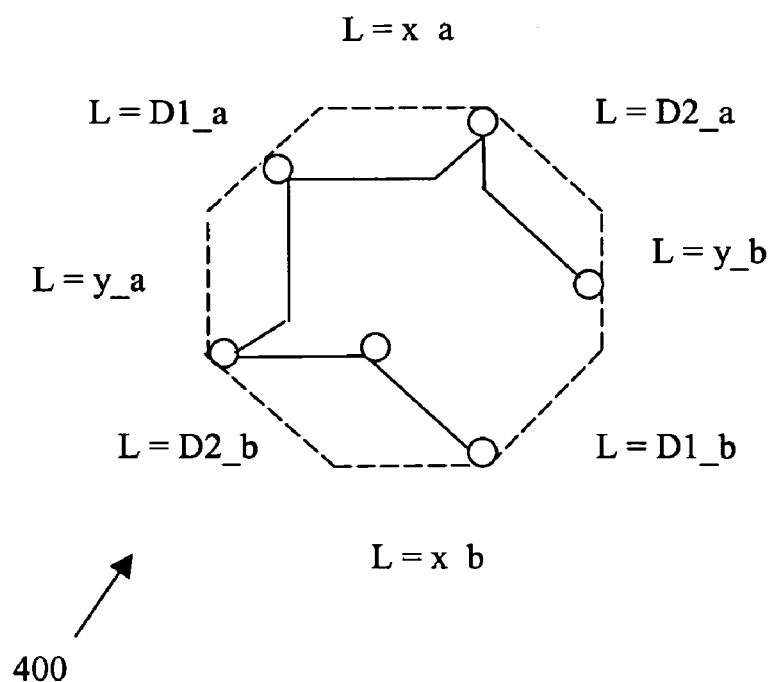
FIG. 4 shows an bounding box that includes at least one diagonal component.

FIG. 4 illustrates a bounding box 400 for a net which considers diagonal wiring in calculating a placement-configuration cost. In this approach, the wirelength cost of a placement configuration is estimated by (1) identifying, for each net in a net list, a bounding box that encloses all the circuit elements of the net, (2) computing an attribute of each bounding box by using a line that can be completely or partially diagonal, and (3) computing the wirelength cost estimate based on the computed attributes. In FIG. 4, an octagonal bounding box 400 has been constructed that encompasses the circuit elements to route in the net.

There are numerous ways to determine the boundaries of a bounding box. One approach is to compare each circuit element location in order for a particular boundary until a suitable boundary for the bounding box is identified. For example, to identify the minimum location along the x-axis of the bounding box, the x coordinate of each circuit element is compared (e.g., to each other or to an established minimum x coordinate value) until the minimum x value is found. If a bounding box is determined, but the location(s) of one or more circuit elements are changed, added, or deleted, then this type of element-by-element comparison must be performed again to determine the new boundaries of the bounding box.

An alternate approach is to use a formulation that is continuous to identify the boundary locations of the bounding box. In one embodiment, the formulation may be continuous along with its derivative. In contrast to the coordinate-by-coordinate approach previously described, this approach allows the boundaries of the bounding box to be determined mathematically using the continuous formulation.

Figure 5:
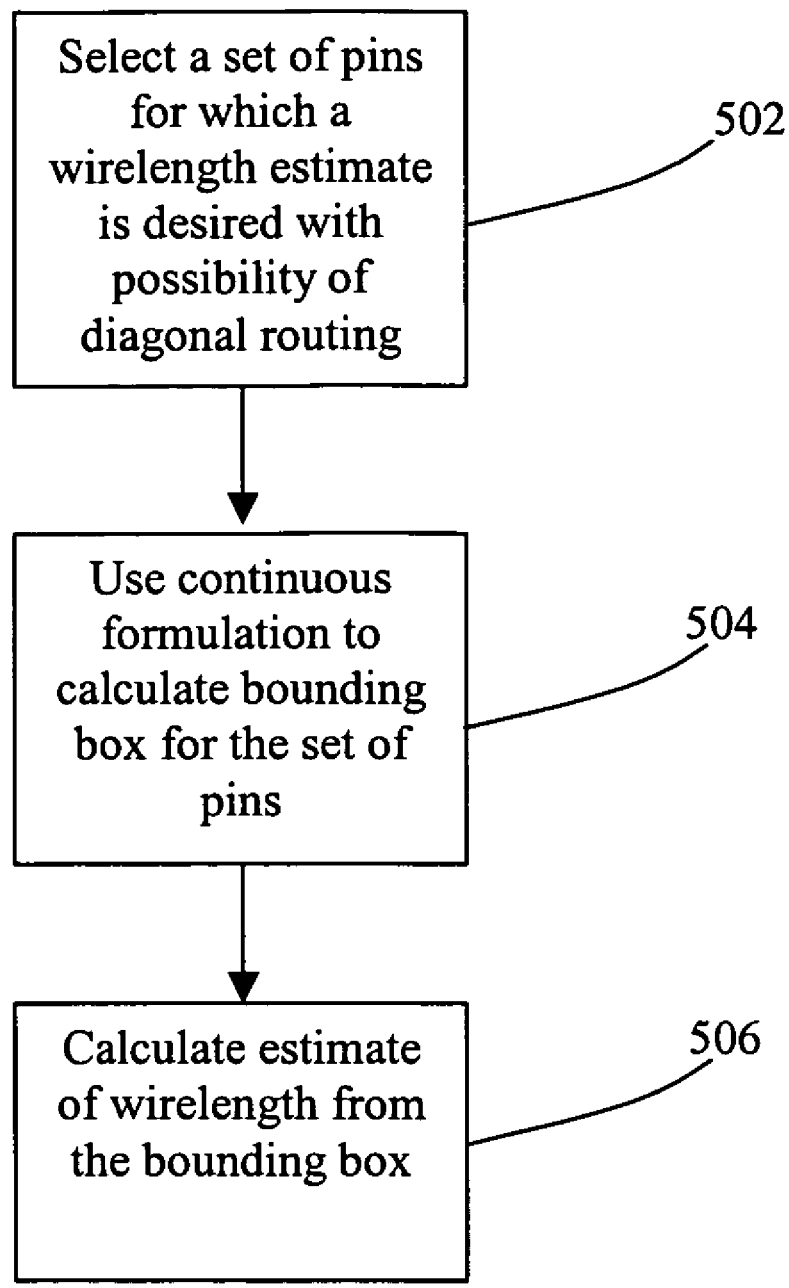
FIG. 5 shows a flowchart of a process for performing wirelength analysis that is continuous along with its derivative.

FIG. 5 shows a flowchart of a process for performing wirelength analysis that is continuous along with its derivative. The first action is to identify a set of elements/pins for which a wirelength estimate is desired and for which there is the possibility of routing in a diagonal direction (502). Each received net has several circuit elements associated with it (i.e., each net is defined to include several circuit elements). In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, the positions of the net circuit elements before the process starts define an initial placement configuration. In some of these embodiments, the initial circuit-element positions are random. In other embodiments, a previous physical-design operation, such as the floor planning, partially or completely specifies the initial positions of these elements. Other embodiments use another placer to specify the initial positions of the circuit elements, and then use process to optimize the placement configuration for a wiring architecture that uses diagonal wiring.

The next action is to use a continuous formulation to identify a bounding box for the set of pins (504). Further details regarding one embodiment of a process for specifying a formulation that is continuous along with its derivative is disclosed in more detail below in conjunction with FIG. 6. One advantage of using a formulation that is continuous is that such a process can be more efficiently and automatically used in a solver for numerically computing an estimated wirelength, since the placement problem can be converted into a mathematical problem that can be solved using numerical optimization techniques.

According to one embodiment, this method generates an estimate of the wirelength cost of a placement by finding the smallest bounding-box that encloses all the net's pins, and computing half the perimeter of this bounding rectangle (506).

Figure 6:
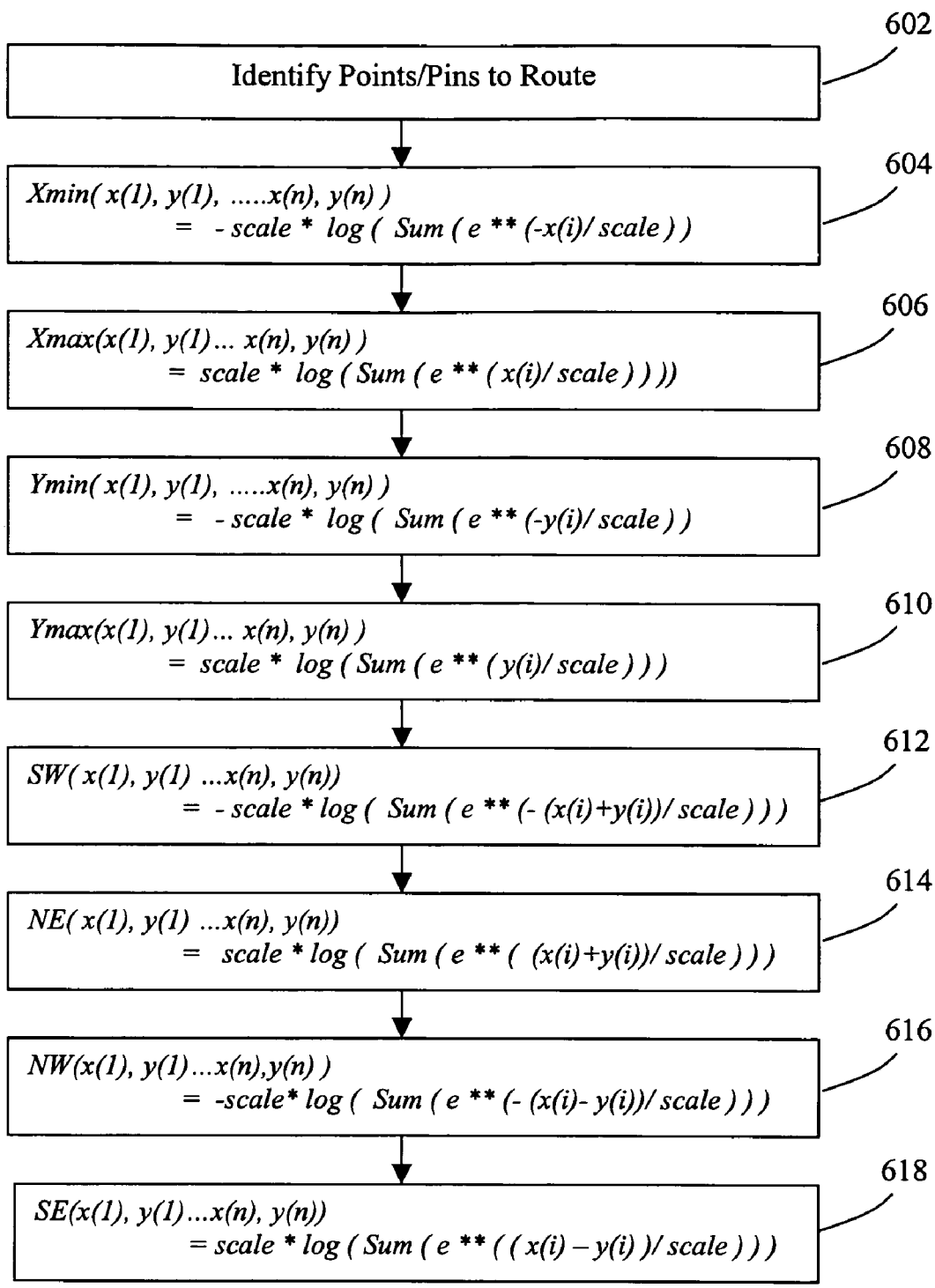
FIG. 6 shows a flowchart of a more detailed process for performing wirelength analysis that is continuous along with its derivative.

FIG. 6 shows a flowchart of a more detailed process for performing wirelength analysis that is continuous along with its derivative. This process is directed at an analytical estimation of the bounding box having diagonal attributes that considers all the layers as available globally. For purposes of this embodiment, consider an IC design having 2 Manhattan layers and 2 Diagonal layers. As previously described, the wirelength is then estimated as ½ of the X bounding box length.

For this process, assume that there are n points (x(i), y(i)) (602). The following functions are employed in the present embodiment:

$$X \min(x(1),y(1) \ldots x(n),y(n)) = -\text{scale}*\log(\text{Sum}(e^{**}(-x(i)/\text{scale})))$$

This function determines the minimum position along the x-axis among the n points (x(i), y(i)) (604).

$$X \max(x(1),y(1) \ldots x(n),y(n)) = \text{scale}*\log(\text{Sum}(e^{**}(x(i)/\text{scale})))$$

This function determines the minimum position along the x-axis among the n points (x(i), y(i)) (606).

$$Y \min(x(1),y(1) \ldots x(n),y(n)) = -\text{scale}*\log(\text{Sum}(e^{**}(-y(i)/\text{scale})))$$

This function determines the minimum position along the y-axis among the n points (x(i), y(i)) (608).

$$Y \max(x(1),y(1) \ldots x(n),y(n)) = \text{scale}*\log(\text{Sum}(e^{**}(y(i)/\text{scale})))$$

This function determines the maximum position along the y-axis among the n points (x(i), y(i)) (610).

$$SW(x(1),y(1) \ldots x(n),y(n)) = -\text{scale}*\log(\text{Sum}(e^{**}(-(x(i)+y(i))/\text{scale})))$$

This function determines the lowest-left position among the n points (x(i), y(i)) (612).

$$NE(x(1),y(1) \ldots x(n),y(n)) = \text{scale} * \log(\text{Sum}(e^{**}((x(i)+y(i))/\text{scale})))$$

This function determines the Uppermost-right position among the n points (x(i), y(i)) (614).

$$NW(x(1),y(1) \ldots x(n),y(n)) = -\text{scale} * \log(\text{Sum}(e^{**}(-(x(i)-y(i))/\text{scale})))$$

This function determines the Uppermost-left position among the n points (x(i), y(i)) (616).

$$SE(x(1),y(1) \ldots x(n),y(n)) = \text{scale} * \log(\text{Sum}(e^{**}((x(i)-y(i))/\text{scale})))$$

This function determines the lowest-right position among the n points (x(i), y(i)) (618).

It is noted that the present application uses various terms to describe orientation, such as "upper", "lower", "left", "right", "vertical", and "horizontal". These terms are used only for illustrative purposes, to more easily facilitate a description of the examples. No limitation as to the invention is intended by using these terms.

An illustrated example will now be presented to describe how these functions are used to determine a wirelength estimate.

FIG. 7A shows an example set of pins to route together for a hypothetical IC layout. The example set of pins include pins 750, 752, 754, 756, 758, 760, and 762. Assume that the x-axis is along the horizontal direction and the y-axis is along the vertical direction of the page.

Figure 7B:
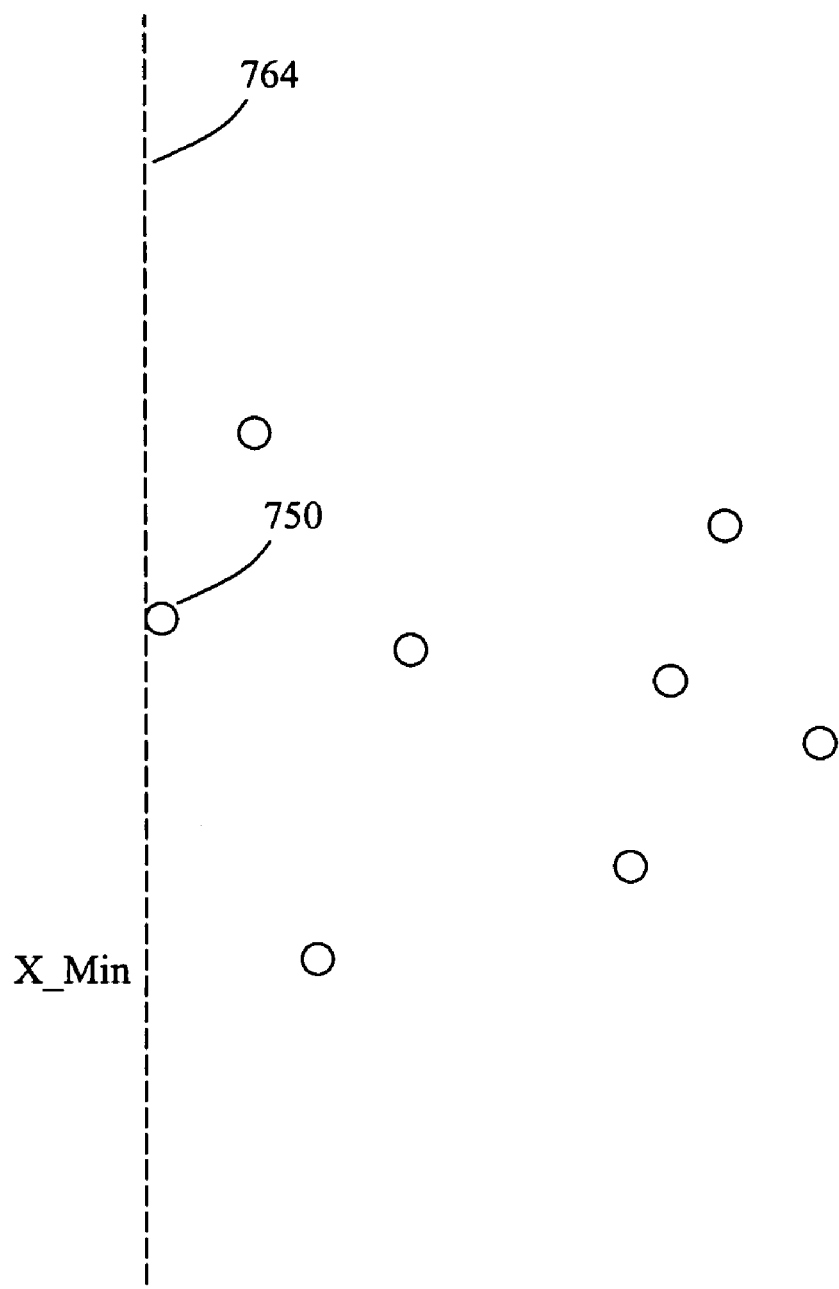

Referring to FIG. 7B, the minimum x position among the set of pins will now be identified. This minimum x position will form the left-most boundary of the smallest bounding box that can be used to enclose the set of pins 750, 752, 754, 756, 758, 760, and 762.

As noted above, applying the function:

$$X\min(x(1),y(1) \ldots x(n),y(n)) = -\text{scale} * \log(\text{Sum}(e^{**}(-x(i)/\text{scale})))$$

to the locations of these pins will identify the minimum position along the X-axis among this set of pins in a continuous manner along with its derivative. Here, the x location of pin 750 is seen to have the minimum x location. A dashed line 764 perpendicular to the X-axis has been drawn to indicate this position along the X-axis.

Figure 7C:
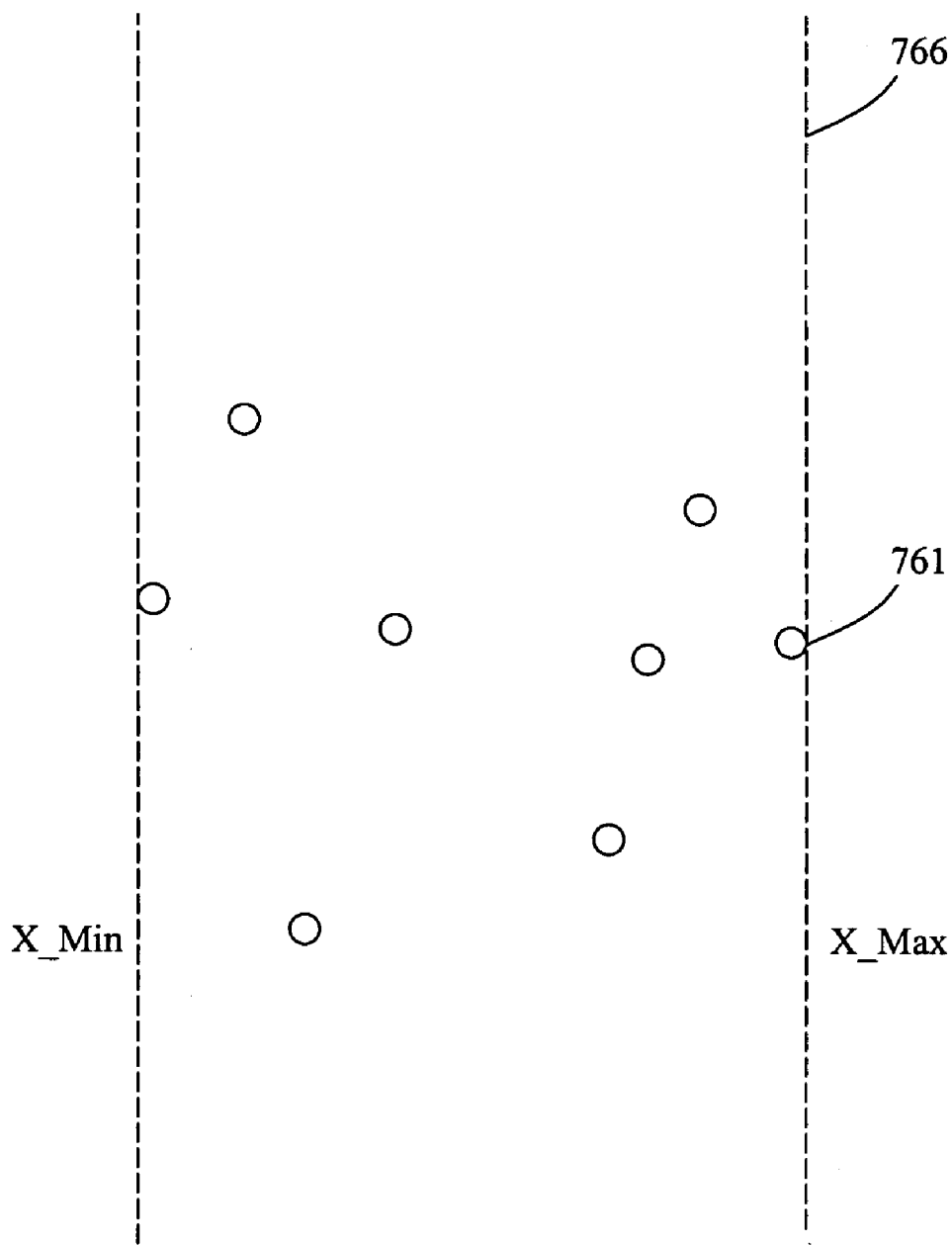

Referring to FIG. 7C, the maximum x position among the set of pins will now be identified. This maximum x position will form the right-most boundary of the smallest bounding box that can be used to enclose the set of pins 750, 752, 754, 756, 758, 760, and 762.

As noted above, applying the function:

$$X\max(x(1),y(1) \ldots x(n),y(n)) = -\text{scale} * \log(\text{Sum}(e^{**}(x(i)/\text{scale})))$$

to the locations of these pins will identify the maximum position along the X-axis among this set of pins in a continuous manner along with its derivative. Here, the x location of pin 761 is seen to have the maximum x location. A dashed line 766 perpendicular to the X-axis has been drawn to indicate this position along the X-axis.

Figure 7D:
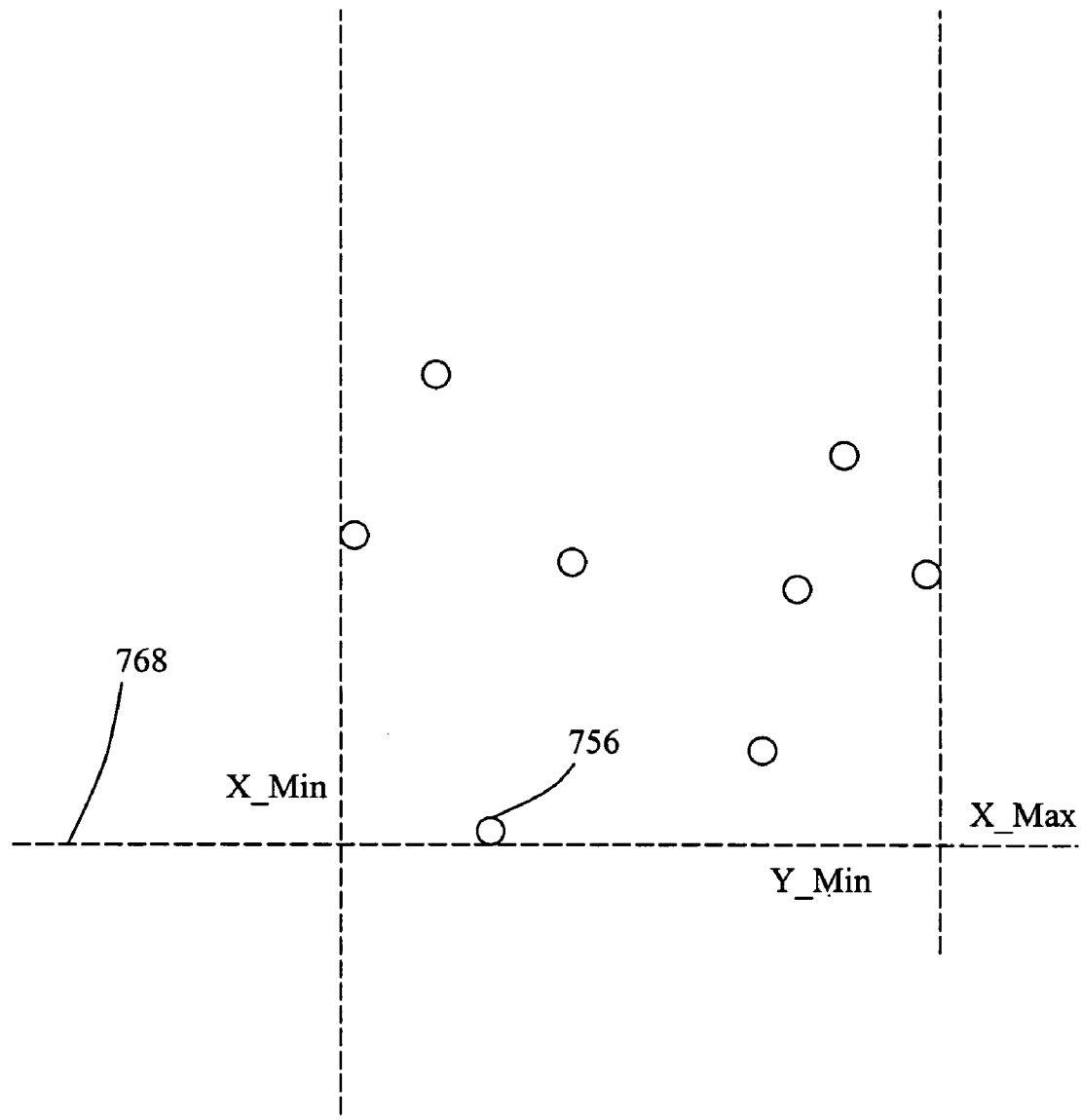

Referring to FIG. 7D, the minimum y position among the set of pins will now be identified. This minimum y position will form the lower boundary of the smallest bounding box that can be used to enclose the set of pins 750, 752, 754, 756, 758, 760, and 762.

As noted above, applying the function:

$$Y\min(x(1),y(1) \ldots x(n),y(n)) = -\text{scale} * \log(\text{Sum}(e^{**}(-y(i)/\text{scale})))$$

to the locations of these pins will identify the minimum position along the Y-axis among this set of pins in a continuous manner along with its derivative. Here, the y location of pin 756 is seen to have the minimum x location. A dashed line 768 perpendicular to the Y-axis has been drawn to indicate this position along the Y-axis.

Figure 7E:
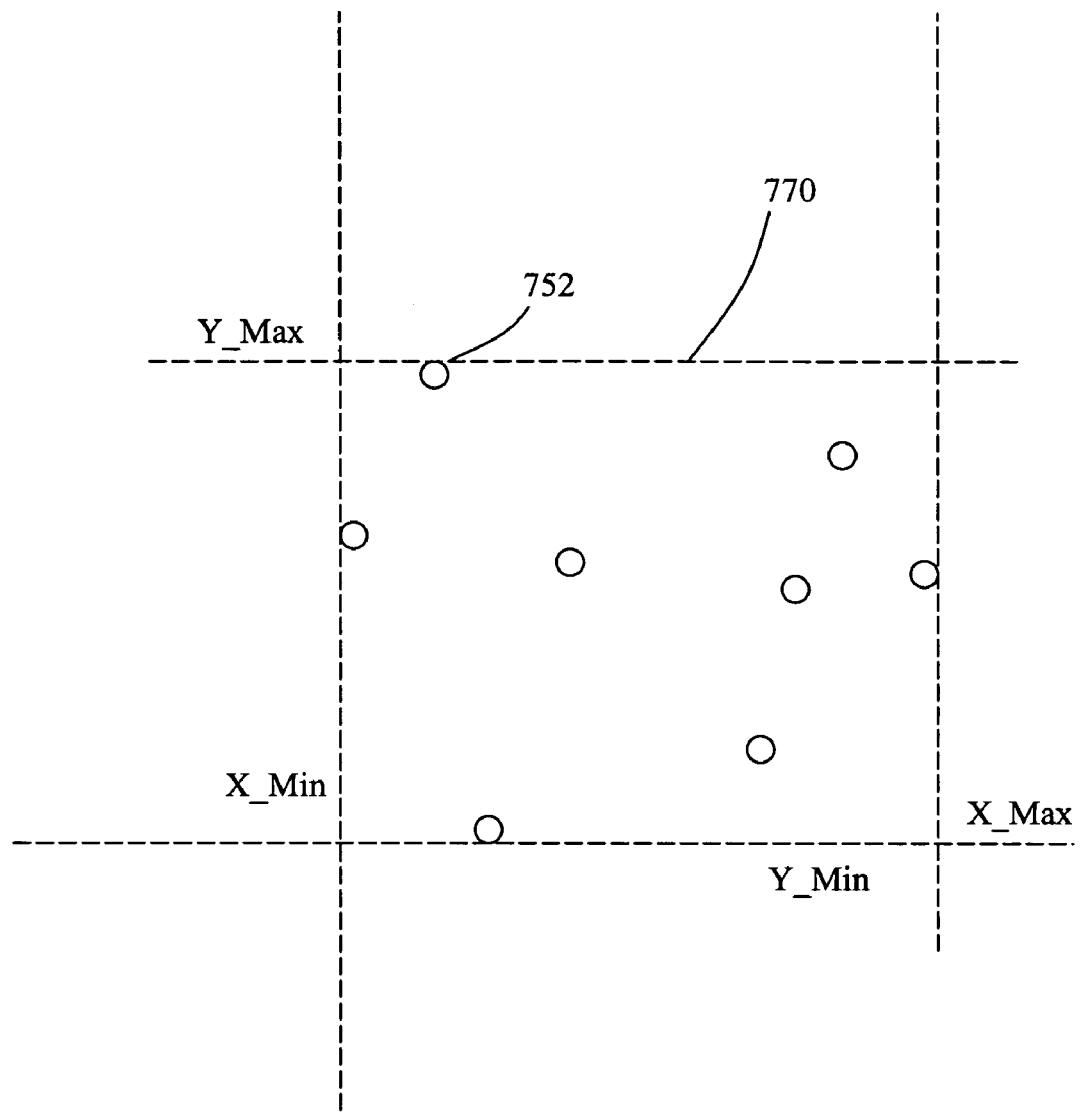

Referring to FIG. 7E, the maximum y position among the set of pins will now be identified. This maximum y position will form the highest boundary of the smallest bounding box that can be used to enclose the set of pins 750, 752, 754, 756, 758, 760, and 762.

As noted above, applying the function:

$$Y\max(x(1),y(1) \ldots x(n),y(n)) = \text{scale} * \log(\text{Sum}(e^{**}(y(i)/\text{scale})))$$

to the locations of these pins will identify the maximum position along the Y-axis among this set of pins in a continuous manner along with its derivative. Here, they location of pin 752 is seen to have the maximum y location. A dashed line 770 perpendicular to the Y-axis has been drawn to indicate this position along the Y-axis.

Figure 7F:
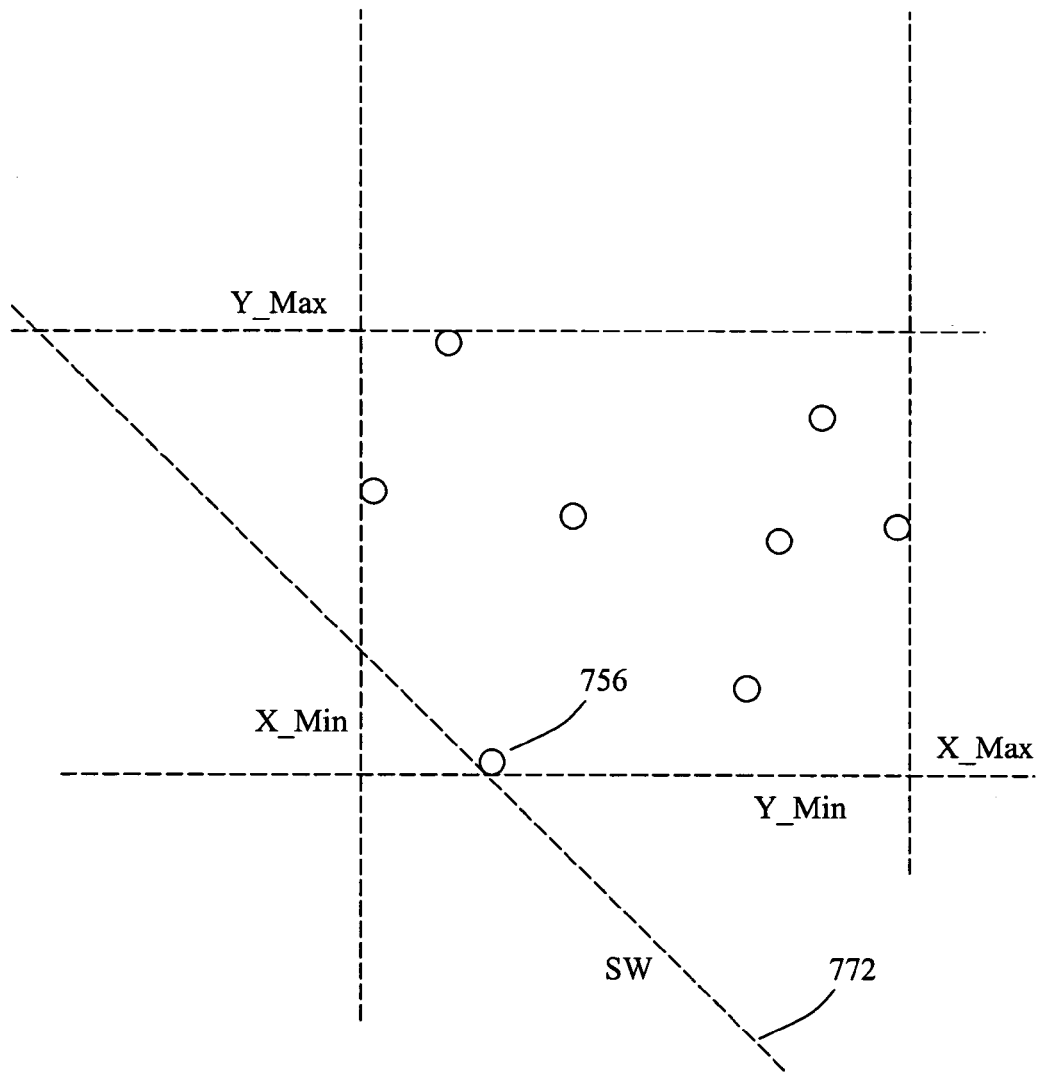

Referring to FIG. 7F, the lowest-left position among the set of pins will now be identified, which is also referred to herein as the "Southwest" or "SW" position. This SW position will form the lower-left diagonal boundary of the smallest bounding box that can be used to enclose the set of pins 750, 752, 754, 756, 758, 760, and 762.

As noted above, applying the function:

$$SW(x(1),y(1) \ldots x(n),y(n)) = -\text{scale} * \log(\text{Sum}(e^{**}(-(x(i)+y(i))/\text{scale})))$$

to the locations of these pins will identify the SW position among this set of pins in a continuous manner along with its derivative. Here, the location of pin 756 is seen to have the lowest-left location. A dashed line 772 has been drawn along the preferred diagonal routing direction (e.g., −45 degrees diagonal) through this identified position.

Figure 7G:
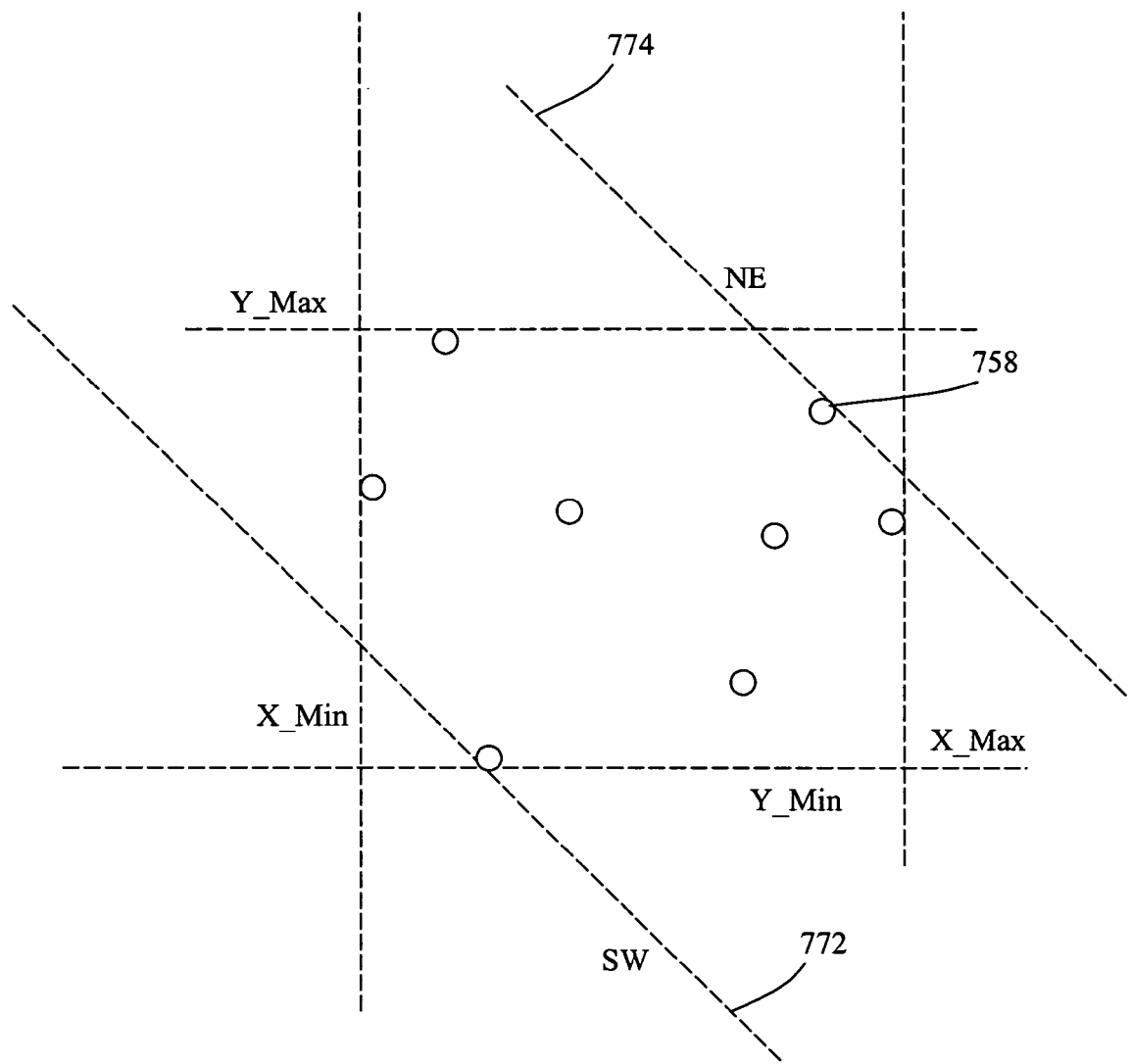

Referring to FIG. 7G, the uppermost-right position among the set of pins will now be identified, which is also referred to herein as the "Northeast" or "NE" position. This NE position will form the upper-right diagonal boundary of the smallest bounding box that can be used to enclose the set of pins 750, 752, 754, 756, 758, 760, and 762.

As noted above, applying the function:

$$NE(x(1),y(1) \ldots x(n),y(n)) = \text{scale} * \log(\text{Sum}(e^{**}(x(i)+y(i))/\text{scale})))$$

to the locations of these pins will identify the NE position among this set of pins in a continuous manner along with its derivative. Here, the location of pin 758 is seen to have the uppermost-right location. A dashed line 774 has been drawn along the preferred diagonal routing direction (e.g., −45 degrees diagonal) through this identified position, and in the same direction as the SW line 772.

Figure 7H:
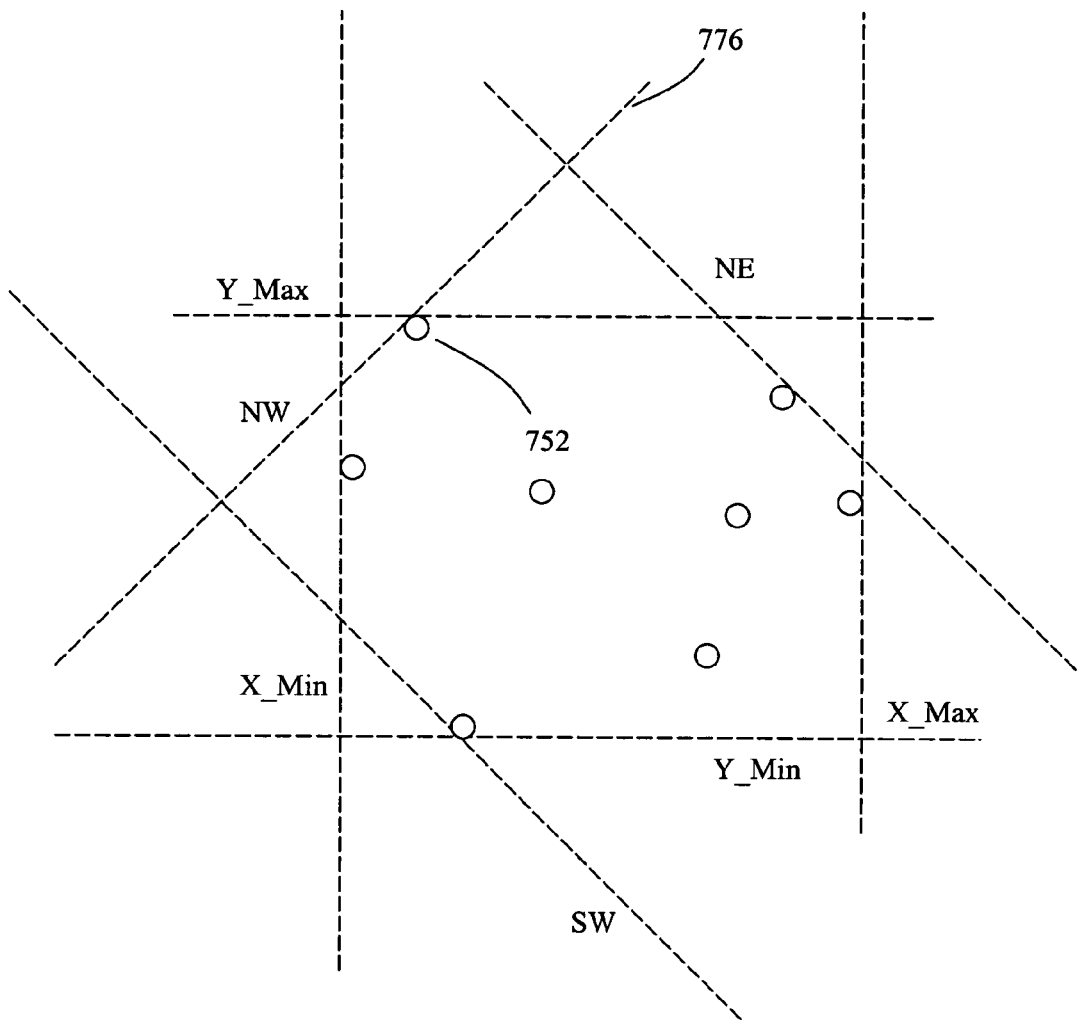
Figure 7I:
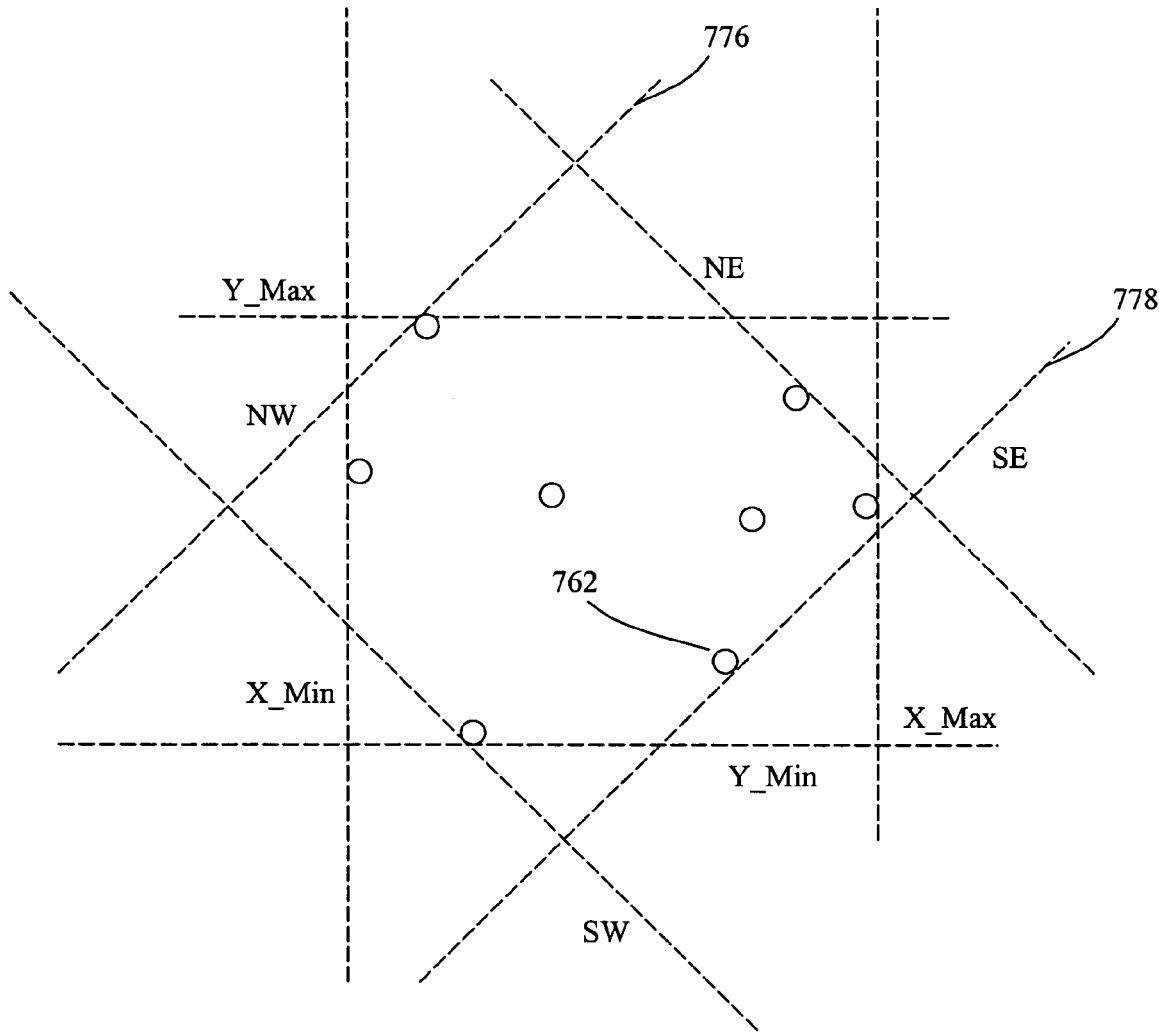

Referring to FIG. 7H, the uppermost-left position among the set of pins will now be identified, which is also referred to herein as the "Northwest" or "NW" position. This NW position will form the upper-left diagonal boundary of the smallest bounding box that can be used to enclose the set of pins 750, 752, 754, 756, 758, 760, and 762.

As noted above, applying the function:

$$NW(x(1),y(1) \ldots x(n),y(n)) = -\text{scale}*\log(\text{Sum}(e^{**}(-(x(i)-y(i))/\text{scale})))$$

to the locations of these pins will identify the NW position among this set of pins in a continuous manner along with its derivative. Here, the location of pin 752 is seen to have the uppermost-left location. A dashed line 776 has been drawn along the preferred diagonal routing direction (e.g., +45 degrees diagonal) through this identified position.

Referring to FIG. 7F, the lowest-right position among the set of pins will now be identified, which is also referred to herein as the "Southeast" or "SE" position. This SE position will form the lower-right diagonal boundary of the smallest bounding box that can be used to enclose the set of pins 750, 752, 754, 756, 758, 760, and 762.

As noted above, applying the function:

$$SE(x(1),y(1) \ldots x(n),y(n)) = \text{scale}*\log(\text{Sum}(e^{**}((x(i)-y(i))/\text{scale})))$$

to the locations of these pins will identify the SE position among this set of pins in a continuous manner along with its derivative. Here, the location of pin 762 is seen to have the lowest-right location. A dashed line 778 has been drawn along the preferred diagonal routing direction (e.g., +45 degrees diagonal) through this identified position, and in the same direction as the SW line 776.

At this point, it can be seen that the intersecting lines form a bounding box in the shape of an octagon around the pins 750, 752, 754, 756, 758, 760, and 762, as shown in solid lines in FIG. 7J. It is also noted that the locations of one or more pins in the set may not form a boundary of the octagonal bounding box. For example, pins 754 and 760 are located within the interior of the bounding box, and therefore their (x,y) locations do not contribute to the location of the boundary of the bounding box 780.

Referring to FIG. 7K, removing the extraneous dashed portions of the lines reveals the contours of the bounding box 780 around the pins 750, 752, 754, 756, 758, 760, and 762. The estimated wirelength for this set of pins can then be estimated by calculating $1/_2$ of the lengths of the sides of the octagonal bounding box 780:

$$\text{Est. Wirelength} = \frac{1}{2}(L_{Y\_max} + L_{Y\_min} + L_{X\_max} + L_{X\_min} + L_{NW} + L_{NE} + L_{SW} + L_{SE})$$

Mathematically, the following function can be used to determine the bounding box length (in which each pair of lines corresponds to an edge on octagonal bounding box):

$$BBox(x(1),y(1) \ldots x(n),y(n)) = \text{sqrt}(2)*(SW(x(1),y(1) \ldots x(n),y(n)) - X\min(x(1),y(1) \ldots x(n),y(n)) - Y\min(x(1),y(1) \ldots x(n),y(n))) + (SE(x(1),y(1) \ldots x(n),y(n)) - SW(x(1),y(1) \ldots x(n),y(n)) + 2*Y\min(x(1),y(1) \ldots x(n),y(n))) + \text{sqrt}(2)*(X\max(x(1),y(1) \ldots x(n),y(n)) - Y\min(x(1),y(1) \ldots x(n),y(n)) - SE(x(1),y(1) \ldots x(n),y(n))) + (NE(x(1),y(1) \ldots x(n),y(n)) + SE(x(1),y(1) \ldots x(n),y(n)) - 2*X\max(x(1),y(1) \ldots x(n),y(n))) + \text{sqrt}(2)*(NE(x(1),y(1) \ldots x(n),y(n)) - X\max(x(1),y(1) \ldots x(n),y(n)) - Y\max(x(1),y(1) \ldots x(n),y(n))) + (NE(x(1),y(1) \ldots x(n),y(n)) - NW(x(1),y(1) \ldots x(n),y(n)) - 2*Y\max(x(1),y(1) \ldots x(n),y(n))) + \text{sqrt}(2)*(NW(x(1),y(1) \ldots x(n),y(n)) - X\min(x(1),y(1) \ldots x(n),y(n)) + Y\max(x(1),y(1) \ldots x(n),y(n))) + (2*X\min(x(1),y(1) \ldots x(n),y(n)) - NW(x(1),y(1) \ldots x(n),y(n)) - SW(x(1),y(1) \ldots x(n),y(n)))$$

This function can be simplified as followed:

$$\frac{1}{2}X\text{Bounding Box length} = (\text{sqrt}(2)-1)(X\max(x(1),y(1) \ldots x(n),y(n)) - X\min(x(1),y(1) \ldots x(n),y(n)) + Y\max(x(1),y(1) \ldots x(n),y(n)) - Y\min(x(1),y(1) \ldots x(n),y(n))) + (1-(1/\text{sqrt}(2)))(NE(x(1),y(1) \ldots x(n),y(n)) - SW(x(1),y(1) \ldots x(n),y(n)) + SE(x(1),y(1) \ldots x(n),y(n)) - NW(x(1),y(1) \ldots x(n),y(n)))$$

This ends up being a weighted sum of the regular rectangular bounding box and the diagonal bounding box for a set of pins.

Availability of Routing Directions

This section will describe embodiments of methods and systems for formulating a wirelength estimate that takes into account whether any of the routing directions are unavailable. Under certain circumstances, one or more of the routing layers may not be available for routing a wire. If this occurs, then the wirelength estimate would likely change to account for the unavailability of the layer.

Figure 8:
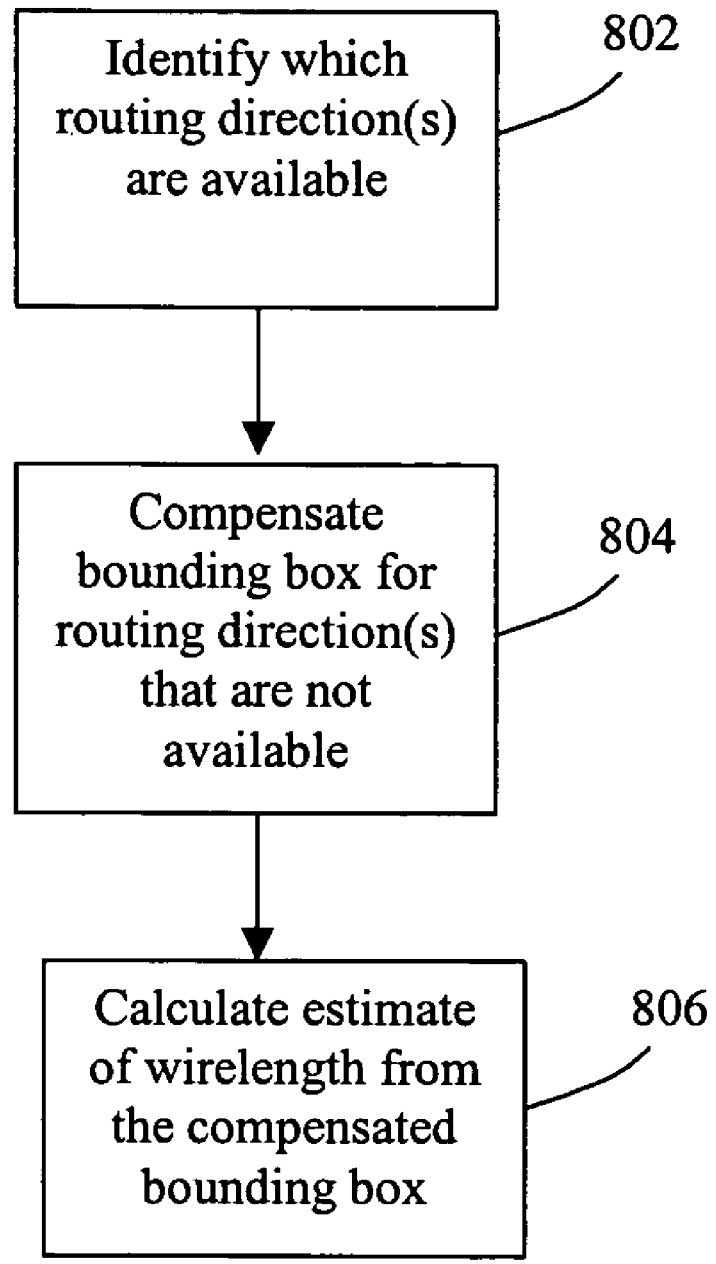
FIGS. 8, 9A–D show flowcharts of processes for formulations that look at availability of routing directions.

FIG. 8 shows a flowchart of a process for making this type of analysis. The process begins by determining which routing directions/layers are available (802).

Once this has been determined, compensation is made to the bounding box length based upon the routing directions that are unavailable (804). In some embodiments, this type of compensation would not have to be made if the length of a particular side of the bounding box corresponding to the unavailable layer does not have a significant value. It is noted that the process can be applied whether or not the bounding box was determined using a continuous formulation.

Once the compensation has been made, then the wirelength estimate is performed based upon the length of the compensated bounding box (806).

For example, consider if both the Manhattan routing directions are unavailable. This means that only the diagonal routing directions are available for routing. If this occurs, then the resulting bounding box is a purely diagonal bounding box (as explained and illustrated in more detail below with respect to FIGS. 11A–B). In this case for an embodiment, the formulation is ($\frac{1}{2}$) of purely a diagonal bounding box length as set forth below:

$$(\frac{1}{4}*\text{sqrt}(2))*(NE(x(1),y(1) \ldots x(n),y(n)) - SW(x(1),y(1) \ldots x(n),y(n)) + SE(x(1),y(1) \ldots x(n),y(n)) - NW(x(1),y(1) \ldots x(n),y(n)))$$

Figure 9A:
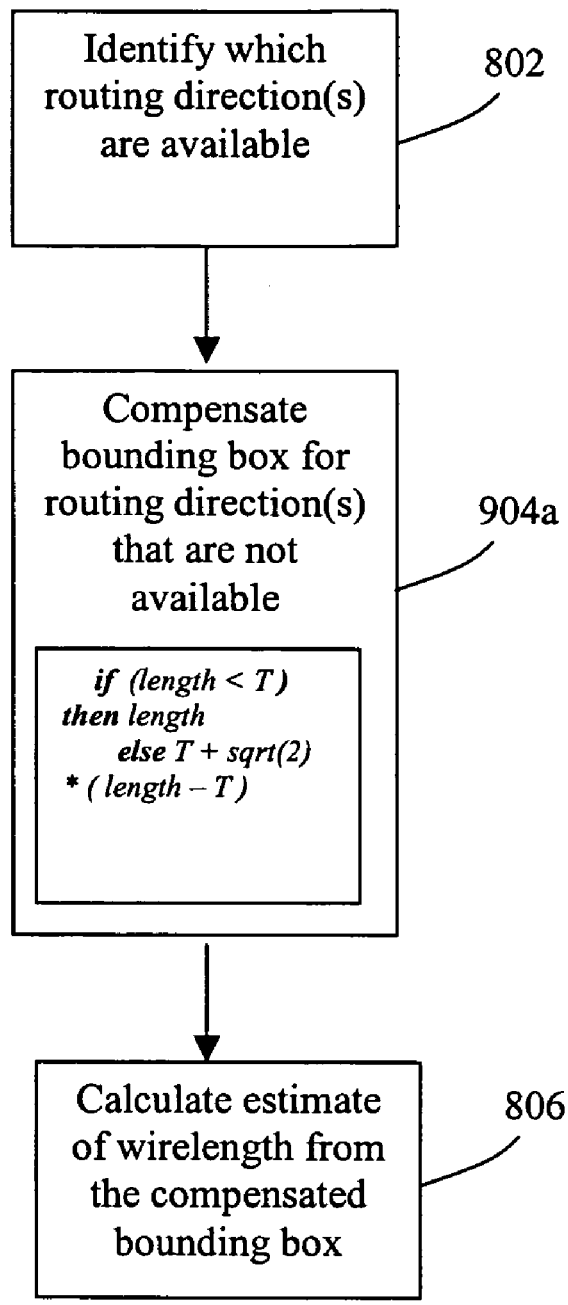
Figure 9B:
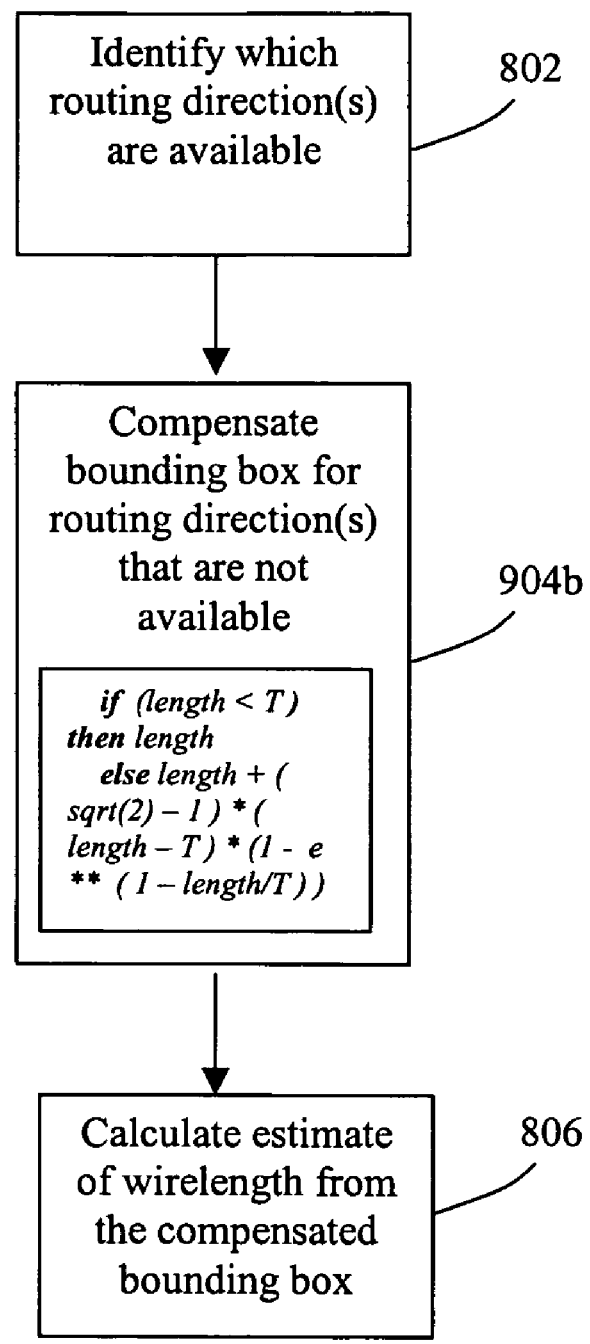

FIGS. 9A and 9B show flowcharts of more detailed processes that look at the availability of routing directions/layers. To illustrate these processes, consider if the first two layers for routing are Manhattan. For example, these may be used mainly for local connections. This scenario can modeled by stating that any horizontal segment or vertical segment has to be less than a threshold T. The layers above the first two layers are available for long connections. In a diagonal physical design approach, the global layers may cover the two diagonal directions at the minimum (D1, D2). They may in addition cover all of the Manhattan directions (L, H) or partially. The present embodiments also present a model to cover the different sets of global layers, e.g., {D1, D2} or {D1, D2, H} or {D1, D2, V} and {D1, D2, H, V} that is also paying attention to the threshold for local directions.

In one embodiment, the process starts from the functions presented above, that provide a continuous and differentiable approach (derivative is continuous as well) for each of the 8 sides of the Octagonal bounding box. Each of the Manhattan sides is corrected through a correction function lenghtcorrectionFunction(sideNumber, originalSideLengthFunction) that returns the corrected length. This function takes in the side number and the original side Length. This function is also continuous and differentiable (with continuous derivatives).

For a Manhattan side that represents a direction that is also a global direction the correction function is an identity function (i.e. the output is same as input). In the case it is a purely local direction, the correction function computes a new larger length if length>T. The total corrected bounding box length is then the sum of the corrected length for each of the sides. This composite function can be clearly seen to be continuous and differentiable (with continuous derivatives).

For a purely local Manhattan direction, a large segment length>T can be corrected by using two diagonal directions to complete the portion of segment>T, i.e., length−T. So the length is computed in FIG. 9A (action 904a) as:

if (length<$T$) then length else $T+sqrt(2)*(length-T)$

Figure 9C:
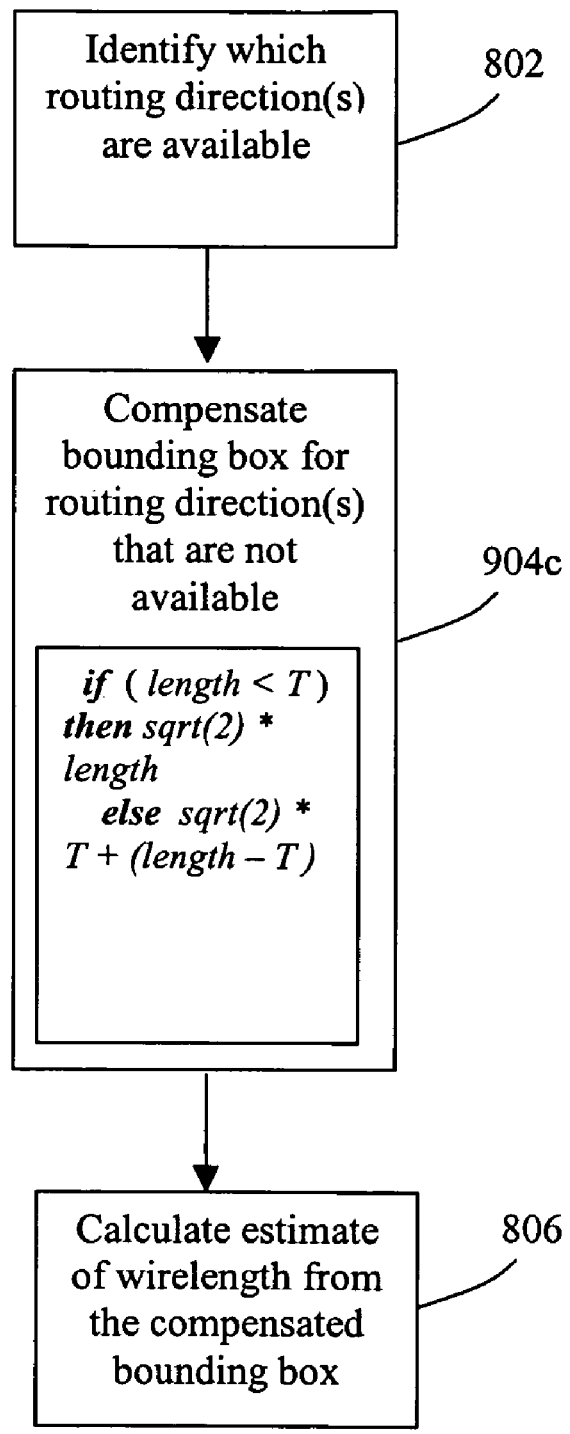

However, the above function does not have a continuous derivative at T. The process can use the following function in FIG. 9B (action 904b) that approximates the above and is continuous with continuous first derivative:

if (length<$T$) then length else $length+(sqrt(2)-1)*(length-T)*(1-e**(1-length/T))$ In the previous paragraphs, a description was provided on correcting the long Manhattan segments of the octangular bounding box that are purely local (e.g., they only are covered by the local layers). In an analogous fashion there may be a need to correct the purely small diagonal segments of the octangular bounding box. This is to model the fact that short connections can be completed using the local layers (which are Manhattan) due to the cost of vias to access the higher layers. So the correction for a diagonal segment of length length can be given by (as shown in action 904c of FIG. 9C):

if (length<$T$) then $sqrt(2)*length$ else $sqrt(2)*T+(length-T)$

Figure 9D:
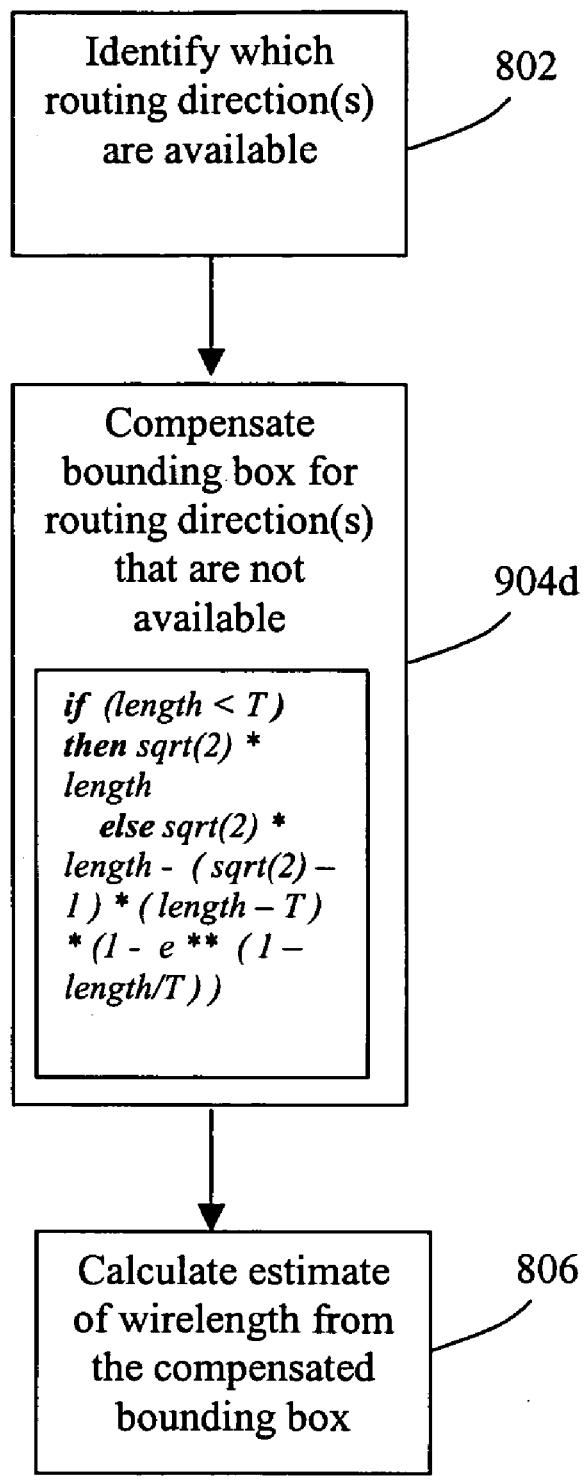
Figure 10:
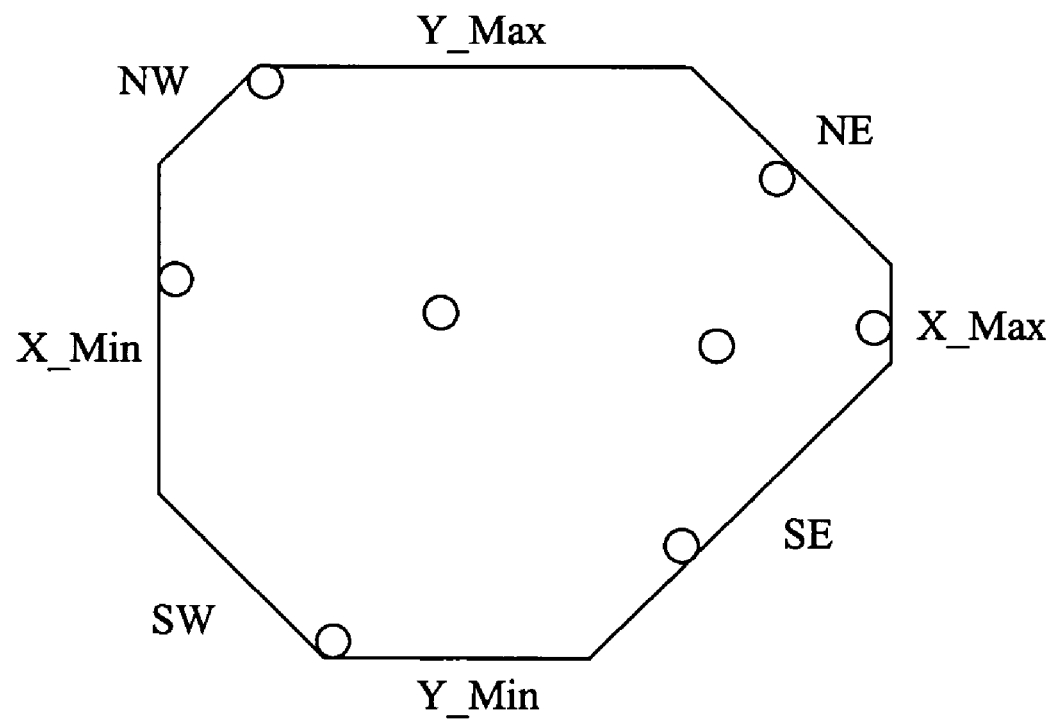
FIG. 10 illustrates an example configuration of pins and an octalinear bounding box that can be associated with those pins.

However the above function does not have a continuous derivative. So the following function (as shown in action 904d of FIG. 9D) can be used instead:

if (length<$T$) then $sqrt(2)*length$ else $sqrt(2)*length-(sqrt(2)-1)*(length-T)*(1-e**(1-length/T))$ Illustrated examples will now be presented of processes to calculate estimated wirelength values which account for unavailability of routing directions. FIG. 10 shows an example set of pins and an octagonal bounding box surrounding the pins. If all of the routing directions are available to route this set of pins, then the length of the bounding box represented in FIG. 10 could be used to estimate the wirelength.

Figure 11A:
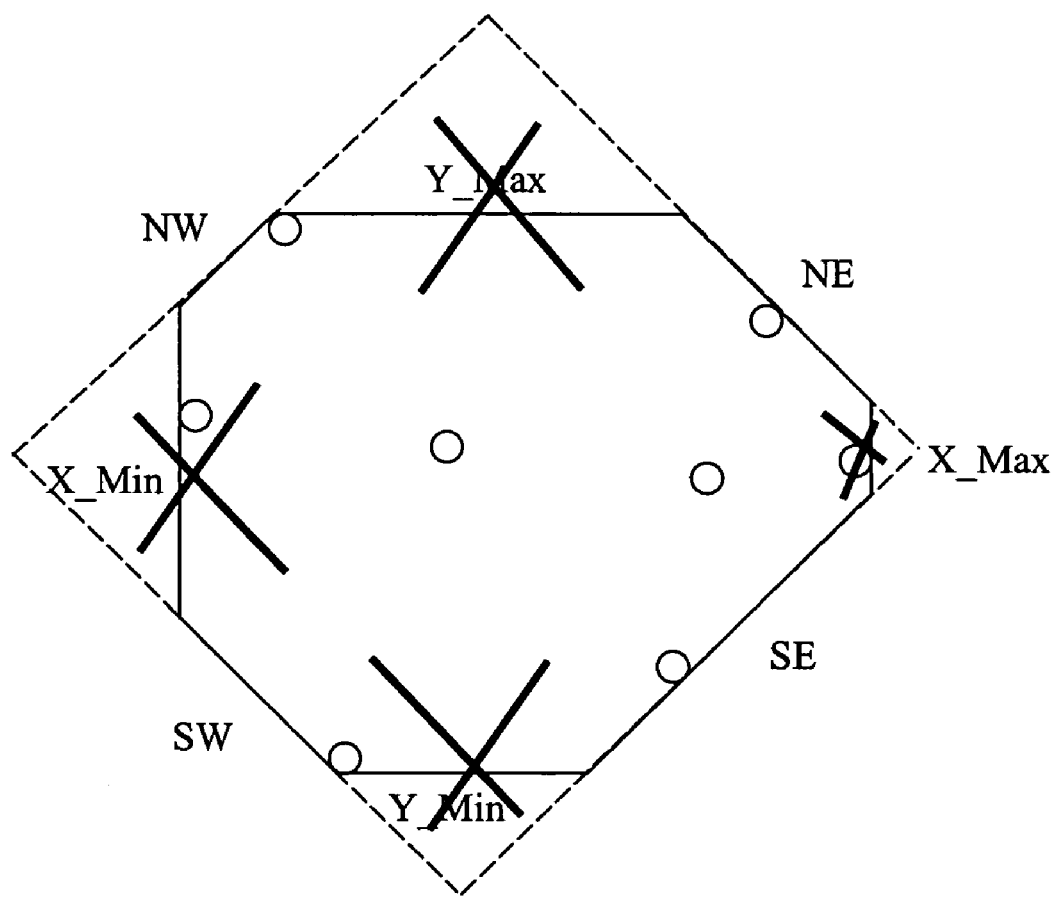

Referring to FIG. 11A, consider if the Manhattan routing layers are not available. If this occurs, then routing can only be performed in the diagonal directions, and not in the vertical and horizontal directions.

If this occurs, then the octagonal bounding box will not have values for the X_Max, Y_Max, X_Min, and Y_Min sides. Instead, the bounding box will only contain values for the NW, SW, NE, and SE sides. Therefore, the lengths of these sides are extended to compensate for the sides that do not have values.

As shown in FIG. 11B, the bounding box is now in the shape of an angled rectangular box. The length of this bounding box can be calculated as described above with respect to FIGS. 8, 9A, and 9B. The estimated wirelength for this bounding box is:

Est. Wirelength=½($L_{NW}+L_{NE}+L_{SW}+L_{SE}$)

It is noted that the resulting bounding box can be considered a non-octagonal bounding box that is in the shape of an angled rectangular box. Alternatively, the bounding box can still be considered to be octagonal, but in which the horizontal and vertical sides have zero lengths. This octagonal view can be applied to any of the compensated bounding boxes to be described below, in which a side that has been compensated to a zero length still forms a "side" of the octagonal bounding box, albeit a non-visible and zero-length side.

Figure 12A:
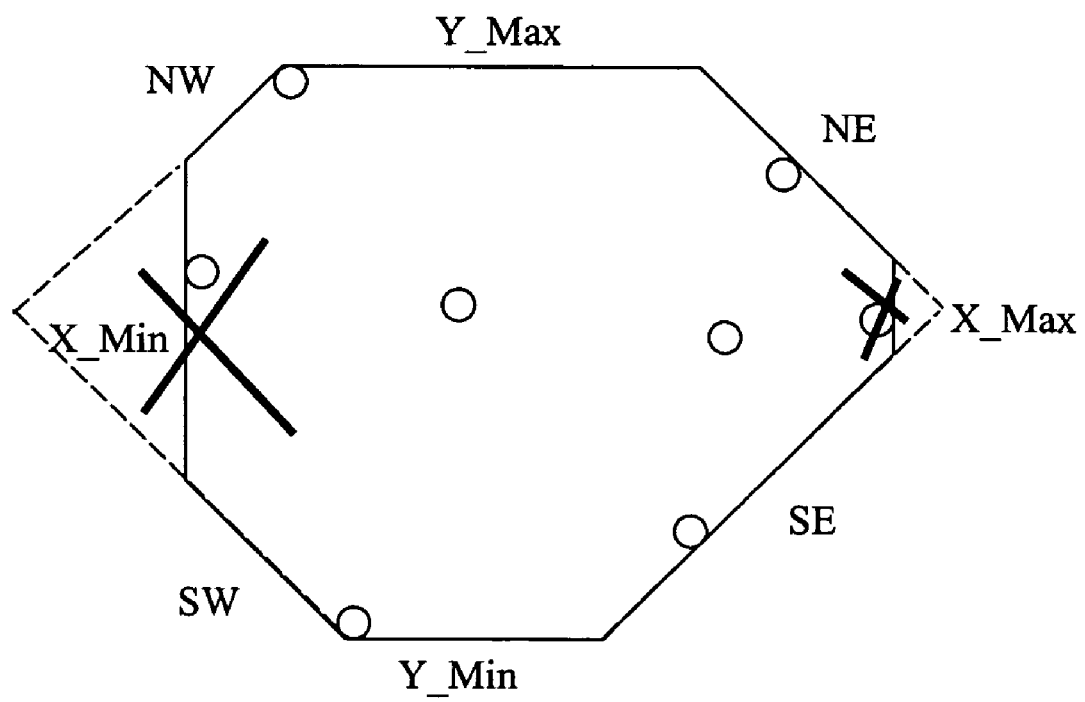

Referring to FIG. 12A, consider if the vertical routing layers are not available. If this occurs, then routing can only be performed in the diagonal and horizontal directions, and not in the vertical directions.

If this occurs, then the octagonal bounding box will not have values for the X_Max and X_Min sides. Instead, the bounding box will only contain values for the Y_Max, Y_Min, NW, SW, NE, and SE sides. Therefore, the lengths of the remaining sides are extended to compensate for the sides that do not have values.

FIG. 12B shows the shape of the resulting bounding box. The length of this bounding box can be calculated as described above with respect to FIGS. 8, 9A, and 9B. The estimated wirelength for this bounding box is:

Est. Wirelength=½($L_{Y\_max}+L_{Y\_min}+L_{NW}+L_{NE}+L_{SW}+L_{SE}$)

It is noted that the X-max side of the original bounding box has a relatively small length. As stated above, compensation may not be necessary if the length of a particular side of the bounding box corresponding to the unavailable layer does not have a significant value. Here, in some embodiments, if the length of the X_Max side is not significant enough or is beneath a defined threshold, then no compensation is performed for this side of the bounding box.

Figure 13A:
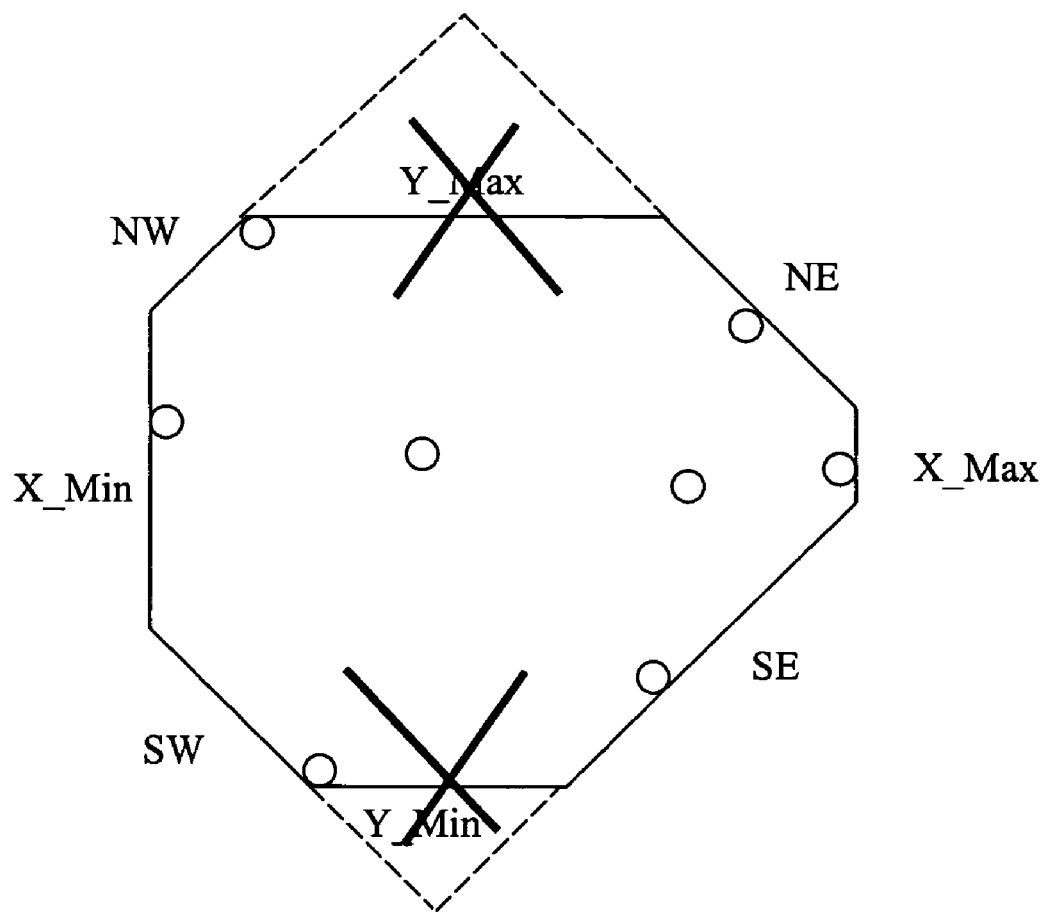

Referring to FIG. 13A, consider if the horizontal routing layers are not available. If this occurs, then routing can only be performed in the diagonal and vertical directions, and not in the horizontal directions.

If this occurs, then the octagonal bounding box will not have values for the Y_Max and Y_Min sides. Instead, the bounding box will only contain values for the X_Max, X_Min, NW, SW, NE, and SE sides. Therefore, the lengths of the remaining sides are extended to compensate for the sides that do not have values.

FIG. 13B shows the shape of the resulting bounding box. The length of this bounding box can be calculated as described above with respect to FIGS. 8, 9A, and 9B. The estimated wirelength for this bounding box is:

Est. Wirelength=½($L_{X\_max}+L_{X\_min}+L_{NW}+L_{NE}+L_{SW}+L_{SE}$)

Figure 14A:
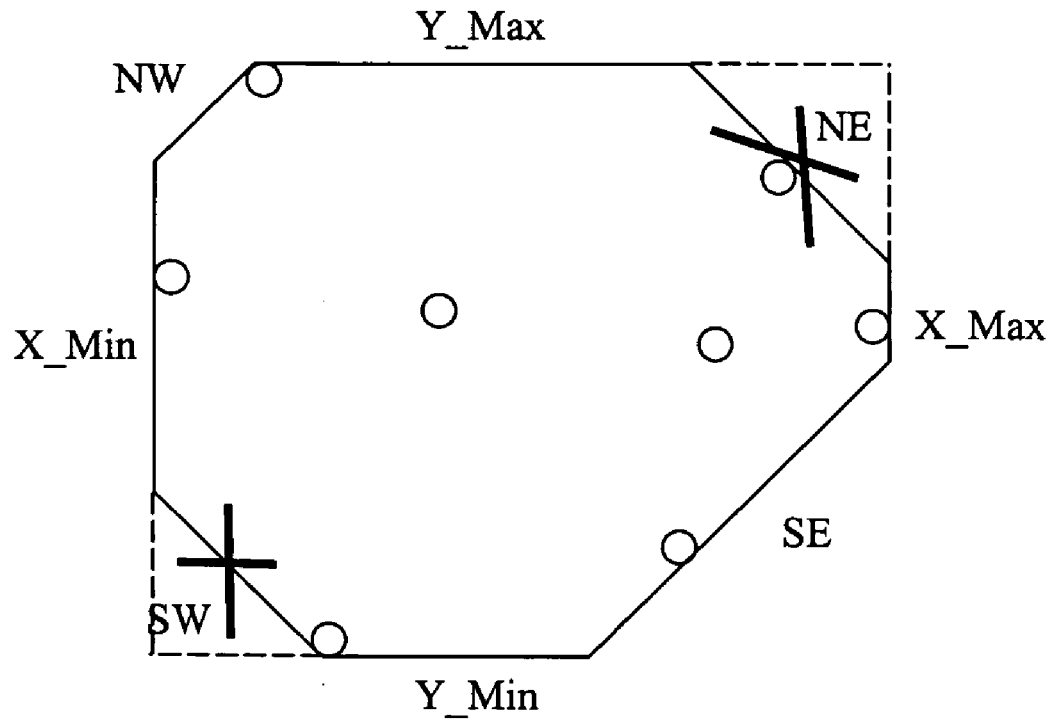

Referring to FIG. 14A, consider if the SW and NE diagonal routing layers are not available. If this occurs, then routing can only be performed in the NW diagonal, SE diagonal, and Manhattan routing directions, and not in the SW and NE diagonal directions.

If this occurs, then the octagonal bounding box will not have values for the SW and NE diagonal sides. Instead, the bounding box will only contain values for the X_Max, X_Min, Y_Max, Y_Min, NW, and SE sides. Therefore, the lengths of the remaining sides are extended to compensate for the sides that do not have values.

FIG. 14B shows the shape of the resulting bounding box. The length of this bounding box can be calculated as described above with respect to FIGS. 8, 9A, and 9B. The estimated wirelength for this bounding box is:

$$\text{Est. Wirelength} = \frac{1}{2}(L_{X\_max} + L_{X\_min} + L_{X\_max} + L_{X\_min} + L_{NW} + L_{SE})$$

Figure 15A:
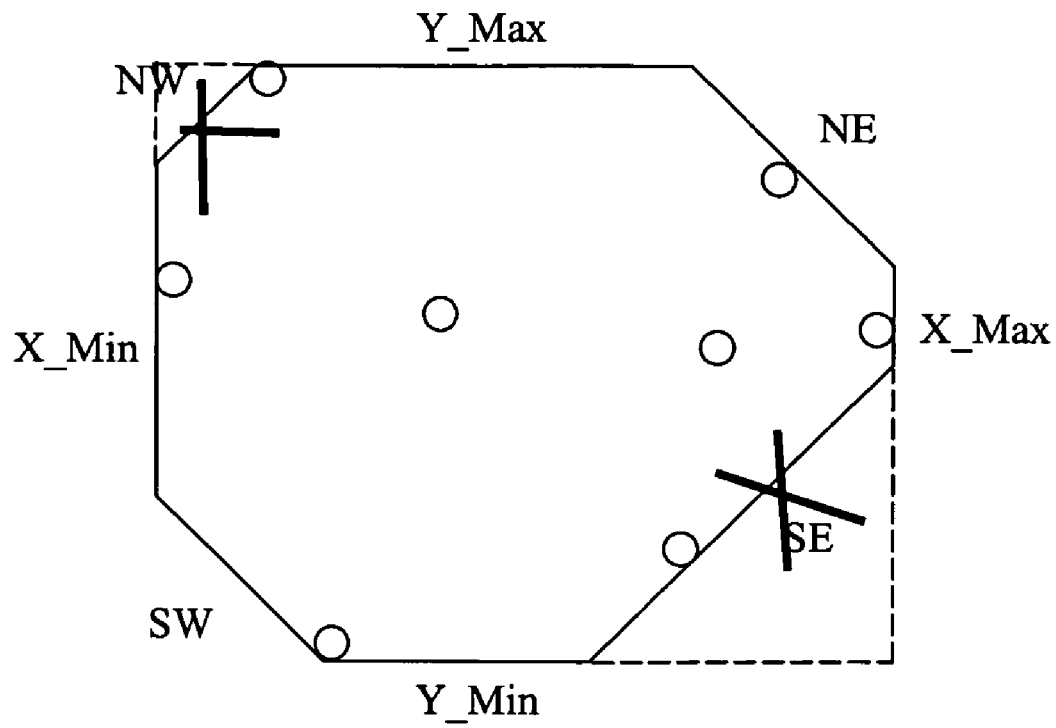

Referring to FIG. 15A, consider if the NW and SE diagonal routing layers are not available. If this occurs, then routing can only be performed in the SW diagonal, NE diagonal, and Manhattan routing directions, and not in the NW and SE diagonal directions.

If this occurs, then the octagonal bounding box will not have values for the NW and SE diagonal sides. Instead, the bounding box will only contain values for the X_Max, X_Min, Y_Max, Y_Min, SW, and NE sides. Therefore, the lengths of the remaining sides are extended to compensate for the sides that do not have values.

FIG. 15B shows the shape of the resulting bounding box. The length of this bounding box can be calculated as described above with respect to FIGS. 8, 9A, and 9B. The estimated wirelength for this bounding box is:

$$\text{Est. Wirelength} = \frac{1}{2}(L_{X\_max} + L_{X\_min} + L_{X\_max} + L_{X\_min} + L_{SW} + L_{NE})$$

If any of sides of the bounding box do not have a significant value, then it is possible that no compensation is needed for that side if a routing direction is unavailable. For example, side X_Max in FIG. 10 may be small enough in length that the unavailability of the vertical routing directions may not require compensation for this said of the bounding box.

After obtaining the wirelength cost of the initial placement configuration, some embodiments use an optimization process that iteratively modifies the placement configuration to improve the placement-configuration cost. In some embodiments, the optimization process uses the process to calculate the placement-configuration cost for each possible iterative modification to the placement configuration. This is further described below in U.S. Pat. No. 6,671,864, which is incorporated herein by reference in its entirety.

Another way of viewing the result of considering available/unavailable routing directions is that the resulting bounding box is modeled as a rotated bounding box which is rotated from horizontal by an angle that is other than 0, 90, 180, 270, or 360 degrees. As noted above, the box can be considered to have any number of non-zero length sides, or can be considered to be an octagonal bounding box with zero or more non-zero length sides. If there are no non-zero length sides, then all routing directions are available and the bounding box is visibly octagonal in shape. As shown in the illustrated examples, if the horizontal and vertical routing directions are not available, then the bounding box is a rotated rectangular shape. If the diagonal routing directions are not available, then the bounding box is a rectangular shape. Other combinations of the rotated box may also occur, e.g., as shown in the examples.

The present invention can be realized in hardware, software, or a combination of hardware and software. A system according to a preferred embodiment of the present invention can be realized in a centralized fashion in one computer system, or in a distributed fashion where different elements are spread across several interconnected computer systems. Any kind of computer system—or other apparatus adapted for carrying out the methods described herein—is suited. A typical combination of hardware and software could be a general-purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

A computer system may include, inter alia, one or more computers and at least a computer usable/readable medium, allowing a computer system, to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer readable medium may include, for example, volatile storage such as RAM, buffers, cache memory, and network circuits. Furthermore, the computer readable medium may comprise computer readable information in a transitory state medium such as a network link and/or a network interface, including a wired network or a wireless network, that allow a computer system to read such computer readable information.

In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

The invention claimed is:

1. A method of estimating an interconnect line length to connect circuit elements of a net in an integrated circuit ("IC") layout, the net representing interconnections between a set of circuit elements in the IC layout, the method comprising:
    (a) identifying a plurality of circuit elements for the net;
    (b) identifying the availability of routing directions to route the plurality of circuit elements;
    (c) compensating a bounding box to take into account one or more unavailable routing directions, the bounding box encompassing the plurality of circuit elements of the net, in which the bounding box is determined using a formulation that is continuous along with its derivative; and (d) using the bounding box to estimate the interconnect line length to connect the circuit elements of the net.

2. The method of claim 1 in which the bounding box is compensated using a continuous formulation.

3. The method of claim 1 in which the bounding box is compensated using a non-continuous formulation.

4. The method of claim 1 in which a side of the bounding box is not compensated.

5. The method of claim 4 in which compensation of the side of the bounding box is not performed if the length of the side is not significant enough or is beneath a defined threshold.

6. A method of estimating an interconnect line length to connect circuit elements of a net in an integrated circuit ("IC") layout, the net representing interconnections between a set of circuit elements in the IC layout, the method comprising:

(a) identifying a plurality of circuit elements for the net;

(b) identifying the availability of routing directions to route the plurality of circuit elements;

(c) compensating a bounding box to take into account one or more unavailable routing directions, the bounding box encompassing the plurality of circuit elements of the net, in which at least one of the following functions is employed to compensate the bounding box:

(i) if (length<$T$) then length else $T+sqrt(2)*(length-T)$;

(ii) if (length<$T$) then length else $length+(sqrt(2)-1)*(length-T)*(1-e^{**}(1-length/T))$;

(iii) if (length<$T$) then $sqrt(2)*length$ else $sqrt(2)*T+(length-T)$; or (iv) if (length<$T$) then $sqrt(2)*length$ else $sqrt(2)*length-(sqrt(2)-1)*(length-T)*(1-e^{**}(1-length/T))$, wherein length is a length of a bounding box segment and T is a threshold: and (d) using the bounding box to estimate the interconnect line length to connect the circuit elements of the net.

7. A method of estimating an interconnect line length to connect circuit elements of a net in an integrated circuit ("IC") layout, the net representing interconnections between a set of circuit elements in the IC layout, the method comprising:

(a) identifying a plurality of circuit elements for the net:

(b) identifying the availability of routing directions to route the plurality of circuit elements:

(c) compensating a bounding box to take into account one or more unavailable routing directions, the bounding box encompassing the plurality of circuit elements of the net, in which the following function is employed to compensate a bounding box in which Manhattan routing directions are not available:

$(¼*sqrt(2))*(NE(x(1),y(1) \ldots x(n),y(n))-SW(x(1),y(1) \ldots x(n),y(n))+SE(x(1),y(1) \ldots x(n),y(n))-NW(x(1),y(1) \ldots x(n),y(n)))$, wherein there are n points each point having a position relative to an x axis and a y axis; and (d) using the bounding box to estimate the interconnect line length to connect the circuit elements of the net.

8. A method of estimating an interconnect line length to connect circuit elements of a net in an integrated circuit ("IC") layout, the net representing interconnections between a set of circuit elements in the IC layout, the method comprising:

(a) identifying a plurality of circuit elements for the net;

(b) identifying the availability of routing directions to route the plurality of circuit elements;

(c) compensating a bounding box to take into account one or more unavailable routing directions, the bounding box encompassing the plurality of circuit elements of the net, in which the compensated bounding box comprises a rotated bounding box that is rotated by an angle other than 0, 90, 180, 270, or 360 degrees, and (d) using the bounding box to estimate the interconnect line length to connect the circuit elements of the net.

9. A computer program product comprising a computer usable medium having executable code to execute a method for estimating an interconnect line length to connect circuit elements of a net in an integrated circuit ("IC") layout, the net representing interconnections between a set of circuit elements in the IC layout, the method comprising:

(a) identifying a plurality of circuit elements for the net;

(b) identifying the availability of routing directions to route the plurality of circuit elements;

(c) compensating a bounding box to take into account one or more unavailable routing directions, the bounding box encompassing the plurality of circuit elements of the net, in which the bounding box is determined using a formulation that is continuous along with its derivative; and (d) using the bounding box to estimate the interconnect line length to connect the circuit elements of the net.

10. A computer program product comprising a computer usable medium having executable code to execute a method for estimating an interconnect line length to connect circuit elements of a net in an integrated circuit ("IC") layout, the net representing interconnections between a set of circuit elements in the IC layout, the method comprising:

(a) identifying a plurality of circuit elements for the net;

(b) identifying the availability of routing directions to route the plurality of circuit elements;

(c) compensating a bounding box to take into account one or more unavailable routing directions, the bounding box encompassing the plurality of circuit elements of the net, in which at least one of the following functions is employed to compensate the bounding box:

(i) if (length<$T$) then length else $T+sqrt(2)*(length-T)$;

(ii) if (length<$T$) then length else $length+(sqrt(2)-1)*(length-T)*(1-e^{**}(1-length/T))$;

(iii) if (length<$T$) then $sqrt(2)*length$ else $sqrt(2)*T+(length-T)$; or (iv) if (length<$T$) then $sqrt(2)*length$ else $sqrt(2)*length-(sqrt(2)-1)*(length-T)*(1-e^{**}(1-length/T))$, wherein length is a length of a bounding box segment and T is a threshold; and (d) using the bounding box to estimate the interconnect line length to connect the circuit elements of the net.

11. A computer program product comprising a computer usable medium having executable code to execute a method for estimating an interconnect line length to connect circuit elements of a net in an integrated circuit ("IC") layout, the net representing interconnections between a set of circuit elements in the IC layout, the method comprising:

(a) identifying a plurality of circuit elements for the net;
(b) identifying the availability of routing directions to route the plurality of circuit elements;
(c) compensating a bounding box to take into account one or more unavailable routing directions, the bounding box encompassing the plurality of circuit elements of the net, in which the following function is employed to compensate a bounding box in which Manhattan routing directions are not available:

$$(\tfrac{1}{4}*sqrt(2))*(NE(x(1),y(1)\ldots x(n),y(n))-SW(x(1),y(1)\ldots x(n),y(n))+SE(x(1),y(1)\ldots x(n),y(n))-NW(x(1),y(1)\ldots x(n),y(n))),$$

wherein there are n points each point having a position relative to an x axis and a y axis; and (d) using the bounding box to estimate the interconnect line length to connect the circuit elements of the net.

12. A computer program product comprising a computer usable medium having executable code to execute a method for estimating an interconnect line length to connect circuit elements of a net in an integrated circuit ("IC") layout, the net representing interconnections between a set of circuit elements in the IC layout, the method comprising:

(a) identifying a plurality of circuit elements for the net;
(b) identifying the availability of routing directions to route the plurality of circuit elements;
(c) compensating a bounding box to take into account one or more unavailable routing directions, the bounding box encompassing the plurality of circuit elements of the net, in which a side of the bounding box is not compensated and, in which compensation of the side of the bounding box is not performed if the length of the side is not significant enough or is beneath a defined threshold; and
(d) using the bounding box to estimate the interconnect line length to connect the circuit elements of the net.

13. A computer program product comprising a computer usable medium having executable code to execute a method for estimating an interconnect line length to connect circuit elements of a net in an integrated circuit ("IC") layout, the net representing interconnections between a set of circuit elements in the IC layout, the method comprising:

(a) identifying a plurality of circuit elements for the net;
(b) identifying the availability of routing directions to route the plurality of circuit elements;
(c) compensating a bounding box to take into account one or more unavailable routing directions, the bounding box encompassing the plurality of circuit elements of the net, in which the compensated bounding box comprises a rotated bounding box that is rotated by an angle other than 0, 90, 180, 270, or 360 degrees; and
(d) using the bounding box to estimate the interconnect line length to connect the circuit elements of the net.

14. A system for estimating an interconnect line length to connect circuit elements of a net in an integrated circuit ("IC") layout, the net representing interconnections between a set of circuit elements in the IC layout, the method comprising:

(a) logic for identifying a plurality of circuit elements for the net;
(b) logic for identifying the availability of routing directions to route the plurality of circuit elements;
(c) logic for compensating a bounding box to take into account one or more unavailable routing directions, the bounding box encompassing the plurality of circuit elements of the net, in which the bounding box is determined using a formulation that is continuous along with its derivative; and
(d) logic for using the bounding box to estimate the interconnect line length to connect the circuit elements of the net.

15. A system for estimating an interconnect line length to connect circuit elements of a net in an integrated circuit ("IC") layout, the net representing interconnections between a set of circuit elements in the IC layout, the method comprising:

(a) logic for identifying a plurality of circuit elements for the net;
(b) logic for identifying the availability of routing directions to route the plurality of circuit elements;
(c) logic for compensating a bounding box to take into account one or more unavailable routing directions, the bounding box encompassing the plurality of circuit elements of the net, in which at least one of the following functions is employed to compensate the bounding box:

(i) if (length<$T$) then length else $T+sqrt(2)*(length-T)$;

(ii) if (length<$T$) then length else $length+(sqrt(2)-1)*(length-T)*(1-e^{**}(1-length/T))$;

(iii) if (length<$T$) then $sqrt(2)*length$ else $sqrt(2)*T+(length-T)$; or (iv) if (length<$T$) then $sqrt(2)*length$ else $sqrt(2)*length-(sqrt(2)-1)*(length-T)*(1-e^{**}(1-length/T))$, wherein length is a length of a bounding box segment and T is a threshold; and (d) logic for using the bounding box to estimate the interconnect line length to connect the circuit elements of the net.

16. A system for estimating an interconnect line length to connect circuit elements of a net in an integrated circuit ("IC") layout, the net representing interconnections between a set of circuit elements in the IC layout, the method comprising:

(a) logic for identifying a plurality of circuit elements for the net;
(b) logic for identifying the availability of routing directions to route the plurality of circuit elements;
(c) logic for compensating a bounding box to take into account one or more unavailable routing directions, the bounding box encompassing the plurality of circuit elements of the net, in which the following function is employed to compensate a bounding box in which Manhattan routing directions are not available:

$$(\tfrac{1}{4}*sqrt(2))*(NE(x(1),y(1)\ldots x(n),y(n))-SW(x(1),y(1)\ldots x(n),y(n))+SE(x(1),y(1)\ldots x(n),y(n))-NW(x(1),y(1)\ldots x(n),y(n))),$$

wherein there are n points each point having a position relative to an x axis and a y axis; and (d) logic for using the bounding box to estimate the interconnect line length to connect the circuit elements of the net.

17. A system for estimating an interconnect line length to connect circuit elements of a net in an integrated circuit ("IC") layout, the net representing interconnections between a set of circuit elements in the IC layout, the method comprising:
  (a) logic for identifying a plurality of circuit elements for the net;
  (b) logic for identifying the availability of routing directions to route the plurality of circuit elements;
  (c) logic for compensating a bounding box to take into account one or more unavailable routing directions, the bounding box encompassing the plurality of circuit elements of the net, in which compensation of the side of the bounding box is not performed if the length of the side is not significant enough or is beneath a defined threshold; and
  (d) logic for using the bounding box to estimate the interconnect line length to connect the circuit elements of the net.

18. A method of estimating an interconnect line length to connect circuit elements of a net in an integrated circuit ("IC") layout, the net representing interconnections between a set of circuit elements in the IC layout, the method comprising:
  (a) identifying a plurality of circuit elements for the net;
  (b) identifying the availability of routing directions to route the plurality of circuit elements;
  (c) compensating a bounding box to take into account one or more unavailable routing directions, wherein a side of the bounding box is not compensated, and compensation of the side of the bounding box is not performed if the length of the side is not significant enough or is beneath a defined threshold, the bounding box encompassing the plurality of circuit elements of the net; and
  (d) using the bounding box to estimate the interconnect line length to connect the circuit elements of the net.

* * * * *